US012563935B2

(12) United States Patent
Shin et al.

(10) Patent No.: US 12,563,935 B2
(45) Date of Patent: Feb. 24, 2026

(54) ORGANIC LIGHT EMITTING DISPLAY DEVICE AND METHOD OF PROVIDING THE SAME

(71) Applicant: Samsung Display Co., LTD., Yongin-si (KR)

(72) Inventors: Hyuneok Shin, Yongin-si (KR); Juhyun Lee, Yongin-si (KR); Jonghee Park, Yongin-si (KR); Joonyong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 351 days.

(21) Appl. No.: 18/346,302

(22) Filed: Jul. 3, 2023

(65) Prior Publication Data

US 2024/0130190 A1 Apr. 18, 2024

(30) Foreign Application Priority Data

Oct. 17, 2022 (KR) ........................ 10-2022-0133564

(51) Int. Cl.
| | |
|---|---|
| *H10K 59/32* | (2023.01) |
| *H10K 59/12* | (2023.01) |
| *H10K 59/122* | (2023.01) |
| *H10K 59/35* | (2023.01) |
| *H10K 71/00* | (2023.01) |
| *H10K 71/20* | (2023.01) |

(52) U.S. Cl.
CPC ......... *H10K 59/32* (2023.02); *H10K 59/1201* (2023.02); *H10K 59/122* (2023.02); *H10K 59/352* (2023.02); *H10K 71/211* (2023.02); *H10K 71/233* (2023.02); *H10K 71/621* (2023.02)

(58) Field of Classification Search
CPC ....................................................... H10K 59/32
USPC .................................................. 313/498–512
See application file for complete search history.

(56) References Cited

U.S. PATENT DOCUMENTS

| | | | | |
|---|---|---|---|---|
| 2014/0353610 A1* | 12/2014 | Lee | ...................... | H10K 59/353 |
| | | | | 438/34 |
| 2017/0194387 A1* | 7/2017 | Oh | .......................... | H10K 50/19 |
| 2022/0140015 A1* | 5/2022 | Kim | ....................... | H10K 50/19 |
| | | | | 257/40 |
| 2024/0057422 A1* | 2/2024 | Yamazaki | .............. | H10K 50/19 |
| 2024/0215328 A1* | 6/2024 | Moon | .................... | H10K 50/19 |

(Continued)

FOREIGN PATENT DOCUMENTS

| | | |
|---|---|---|
| CN | 105489788 | 4/2016 |
| KR | 10-2010-0062710 | 6/2010 |
| KR | 10-2014-0079684 | 6/2014 |

*Primary Examiner* — Christopher M Raabe
(74) *Attorney, Agent, or Firm* — Sughrue Mion, PLLC

(57) ABSTRACT

An organic light emitting display device includes a first to a third pixel electrodes and a pixel defining layer disposed on a substrate, a first light emitting layer disposed on the first pixel electrode, a second light emitting layer disposed on the first to third pixel electrodes, a third light emitting layer disposed on the third pixel electrode, a thickness compensation layer disposed on the third pixel electrode, overlapping the third light emitting layer, and including Z-ITO having a ZnO$_x$ content of about 50 wt % or more, and about 90 wt % or less, and a common electrode disposed on the first to third light emitting layers.

9 Claims, 16 Drawing Sheets

1000

(56) References Cited

U.S. PATENT DOCUMENTS

| 2024/0324377 A1* | 9/2024 | Yamazaki | .............. | H10K 59/30 |
| 2025/0056966 A1* | 2/2025 | Im | ........................ | H10K 85/622 |

* cited by examiner

1000

OL {
270
370:370R,370G,370B
190:190R,190G,190B
}

373:373R,373G,373B
373':373R',373B'

ORGANIC LIGHT EMITTING DISPLAY DEVICE AND METHOD OF PROVIDING THE SAME

CROSS REFERENCE TO RELATED APPLICATION(S)

This application claims priority to and benefits of Korean Patent Application No. 10-2022-0133564 under 35 USC § 119 filed on Oct. 17, 2022, in the Korean Intellectual Property Office, the entire contents of which are incorporated herein by reference.

BACKGROUND

1. Technical Field

Embodiments relate to an organic light emitting display device and a method of providing the display device. For example embodiments relate to an organic light emitting display device having high light efficiency and a method of manufacturing (or providing) the display device.

2. Description of the Related Art

Display device is a device that displays an image for providing visual information to a user. Among display devices, an organic light emitting display device (OLED) has recently attracted attention.

The OLED has a self-emission characteristic and does not require a separate light source, unlike a liquid crystal display device, so that thickness and weight may be reduced. The OLED may have high-quality characteristics such as low power consumption, high luminance, high reaction speed, and the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An organic light emitting element included in the OLED may include an organic thin film. Such the organic thin film may be deposited on a substrate using a vacuum thermal evaporation method or the like within the spirit and the scope of the disclosure. The organic thin film may be formed using a fine metal mask (FMM) for each R, G, and B pixel. At this time, the mask may be replaced for each process of forming each of the pixels. In case that the mask is replaced, scratches or the like may occur on the substrate, which may cause defective pixels.

The technical objectives to be achieved by the disclosure are not limited to those described herein, and other technical objectives that are not mentioned herein would be clearly understood by a person skilled in the art from the description of the disclosure.

Embodiments provide an organic light emitting display device.

Embodiments provide a method of manufacturing (or providing) the display device.

The organic light emitting display device may include a first pixel electrode, a second pixel electrode, a third pixel electrode, a pixel defining layer, a first light emitting layer, a second light emitting layer, a third light emitting layer, a thickness compensation layer, and a common electrode. A substrate may include a first pixel area, a second pixel area, and a third pixel area. The first pixel electrode may be disposed on the substrate, and in the first pixel area. The second pixel electrode may be disposed on the substrate, and in the second pixel area. The third pixel electrode may be disposed on the substrate, and in the third pixel area. The pixel defining layer may be disposed on the substrate, and may expose upper surfaces of the first pixel electrode, the second pixel electrode and the third pixel electrode. The first light emitting layer may emit a first color light, and may be disposed on the first pixel electrode. The second light emitting layer may emit a second color light different from the first color light, and may be disposed on the first pixel electrode, the second pixel electrode and the third pixel electrode. The third light emitting layer may emit a third color light different from the first color light and the second color light, and may be disposed on the third pixel electrode. The thickness compensation layer may be disposed on the third pixel electrode, may overlap the third light emitting layer, and may include Z-ITO having $ZnO_x$ content of about 50 wt. % or more, and about 90 wt. % or less. The common electrode may be disposed on the first light emitting layer, the second light emitting layer and the third light emitting layer.

In an embodiment, each of the first pixel electrode, the second pixel electrode and the third pixel electrode may include a first transparent oxide layer, a metal layer, and a second transparent oxide layer. The first transparent oxide layer may be disposed on the substrate. The metal layer may be disposed on the first transparent oxide layer. The second transparent oxide layer may be disposed on the metal layer.

In an embodiment, the first transparent oxide layer may include ITO. The metal layer may include Ag. The second transparent oxide layer may include ITO.

In an embodiment, an etch selectivity of the thickness compensation layer and an etch selectivity of the second transparent oxide layer may be different from each other.

In an embodiment, the etch selectivity of the thickness compensation layer may be greater than the etch selectivity of the second transparent oxide layer.

In an embodiment, each of the first pixel electrode, the second pixel electrode and the third pixel electrode may be an anode, and the common electrode may be a cathode.

In an embodiment, each of the first color light, the second color light and the third color light may be resonated between the anode and the cathode.

In an embodiment, a width of the third pixel electrode and a width of the thickness compensation layer may be different from each other, in a cross-sectional view.

In an embodiment, the width of the third pixel electrode may be greater than the width of the thickness compensation layer.

A method of manufacturing an organic light emitting display may include a first transparent oxide film, a metal film, a second transparent oxide film, and a thickness compensation film sequentially formed on a substrate including a first pixel area, a second pixel area, and a third pixel area. A photoresist film may be formed on the thickness compensation film. A first photoresist pattern in the first pixel area and the second pixel area and a second photoresist pattern in the third pixel area may be formed. Each of the first photoresist pattern and the second photoresist pattern may be formed by performing an exposure and a development process using a half-tone mask on the photoresist film. A first portion of a thickness compensation layer in each of the first pixel area and the second pixel area, a second portion of the thickness compensation layer in the third pixel area, a first transparent oxide layer, a metal layer, and a second transparent oxide layer in each of the first pixel area, the second pixel area, and the third pixel area. Each of the first transparent oxide layer, the metal layer, and the second transparent oxide layer may be formed, by performing a primary etching process on the first transparent oxide film, the metal film, the second transparent oxide film, and the thickness compensation film. The first portion of the thickness compensation layer and a portion of the second portion of the thickness compensation layer may be removed.

In an embodiment, the first photoresist pattern may have a first thickness and the second photoresist pattern may have a second thickness different from the first thickness, through the exposure and the development process.

In an embodiment, the first thickness may be less than second thickness.

In an embodiment, the removing of the first portion of the thickness compensation layer and the portion of the second portion of the thickness compensation layer may include a remaining photoresist film in the third pixel area. The remaining photoresist film may be formed by removing of the first photoresist pattern and the portion of the second photoresist pattern through an ashing process. The first portion of the thickness compensation layer and the portion of the second portion of the thickness compensation layer may be removed by performing a secondary etching process.

In an embodiment, a portion of a side surface of the second portion of the thickness compensation layer may be removed through the secondary etching process.

In an embodiment, the method may further include removing the remaining photoresist film after the removing of the first portion of the thickness compensation layer and the portion of the second portion of the thickness compensation layer by performing the secondary etching process.

In an embodiment, the removing of the first portion of the thickness compensation layer and the portion of the second portion of the thickness compensation layer may be removing through performing an etching using an etchant having an etch selectivity of the thickness compensation layer and an etch selectivity of the second transparent oxide layer different each other.

In an embodiment, the etch selectivity of the thickness compensation layer may be greater than the etch selectivity of the second transparent oxide layer.

In an embodiment, the thickness compensation layer may be formed of Z-ITO.

In an embodiment, $ZnO_x$ content among the Z-ITO may be about 50 wt. % or more, and about 90 wt. % or less.

In an embodiment, the first transparent oxide layer may be formed of ITO, the metal layer may be formed of Ag, and the second transparent oxide layer may be formed of ITO.

The organic light emitting display device according to an embodiment may include the first pixel electrode, the second pixel electrode, the third pixel electrode, the pixel defining layer, the first light emitting layer, the second light emitting layer, the third light emitting layer, the thickness compensation layer, and the common electrode. A substrate may include the first pixel area, the second pixel area, and the third pixel area. The first pixel electrode may be disposed on the substrate, and in the first pixel area. The second pixel electrode may be disposed on the substrate, and in the second pixel area. The third pixel electrode may be disposed on the substrate, and in the third pixel area. The pixel defining layer may be disposed on the substrate, and may expose upper surfaces of the first pixel electrode, the second pixel electrode and the third pixel electrode. The first light emitting layer may emit the first color light, and may be disposed on the first pixel electrode. The second light emitting layer may emit the second color light different from the first color light, and may be disposed on the first pixel electrode, the second pixel electrode and the third pixel electrode. The third light emitting layer may emit the third color light different from the first color light and the second color light, and may be disposed on the third pixel electrode. The thickness compensation layer may be disposed on the third pixel electrode, in the third light emitting layer, and may include the Z-ITO having the $ZnO_x$ content of about 50 wt. % or more, and about 90 wt. % or less. The common electrode may be disposed on the first light emitting layer, the second light emitting layer and the third light emitting layer. Accordingly, the resonated thickness of the OLED may be controlled, and the FMM process may be omitted, so that the OLED for ultra-high resolution may be produced.

The method of manufacturing an organic light emitting display device, the method may include the first transparent oxide film, the metal film, the second transparent oxide film, and the thickness compensation film may be sequentially formed on a substrate including the first pixel area, the second pixel area, and the third pixel area. And, the photoresist film may be formed on the thickness compensation film. The first photoresist pattern in the first pixel area and the second pixel area and the second photoresist pattern in the third pixel area may be formed. The first photoresist pattern and the second photoresist pattern may be formed by performing the exposure and the development process using the half-tone mask on the photoresist film. The first portion of the thickness compensation layer in each of the first pixel area and the second pixel area, and the second portion of the thickness compensation layer in the third pixel area, and the first transparent oxide layer, the metal layer, the second transparent oxide layer in each of the first pixel area, the second pixel area, and the third pixel area. Each of the first transparent oxide layer, the metal layer and the second transparent oxide layer may be formed, by performing the primary etching process on the first transparent oxide film, the metal film, the second transparent oxide film, and the thickness compensation film. The first portion of the thickness compensation layer and the portion of the second portion of the thickness compensation layer may be removed. Accordingly, the process step of forming of the thickness compensation layer may be simplified, and productivity of the OLED may be improved.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
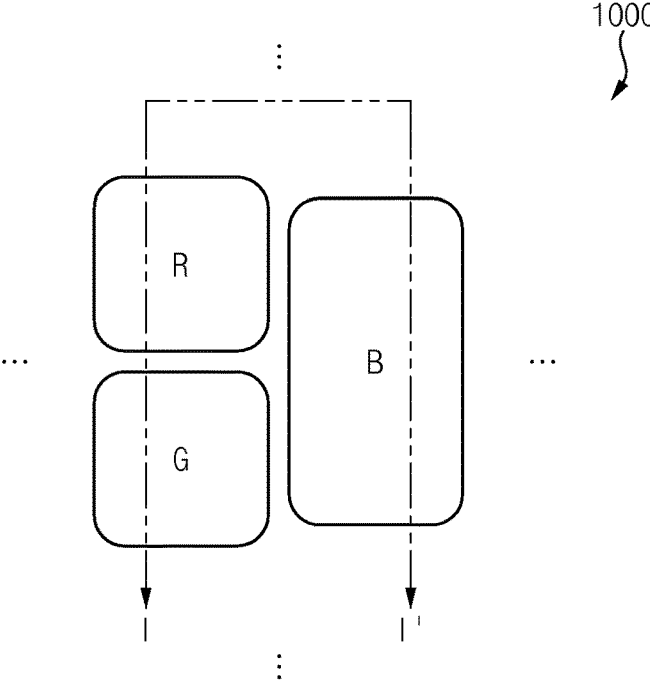
FIG. 1 is a schematic plan view illustrating an arrangement of pixels included in an organic light emitting display device according to an embodiment.

Hereinafter, display devices in accordance with embodiments will be described in more detail with reference to the accompanying drawings. The same reference numerals are used for the same components in the drawings, and redundant descriptions of the same components may be omitted.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

FIG. 1 is a schematic plan view illustrating an arrangement of pixels included in an organic light emitting display device according to an embodiment.

Referring to FIG. 1, the display device 1000 according to the embodiment of the disclosure may include a red pixel R displaying red color, a green pixel G displaying green color, and a blue pixel B displaying blue color. Each of the red pixel R, the green pixel G, and the blue pixel B may be basic pixels for expressing full color.

The red pixel R, the green pixel G, and the blue pixel B may form one group and may be repeatedly arranged or disposed in an n×m matrix. For example, the red pixels R and the green pixels G may be alternately arranged or disposed along a column, and the blue pixels B may be continuously arranged or disposed along a column adjacent to the column.

The red pixel R and the green pixel G may have substantially a same area. The blue pixel B may have a larger area than each of the red pixel R and the green pixel G. By forming the blue pixel B with the larger area than the red pixel R and the green pixel G, a luminance of the red pixel R, the green pixel G, and the blue pixel B may be balanced. However, the disclosure may not be limited thereto, and a shape of the pixels and the arrangement of the pixels may be variously modified, and the pixels may further include a white pixel displaying white color.

Figure 2:
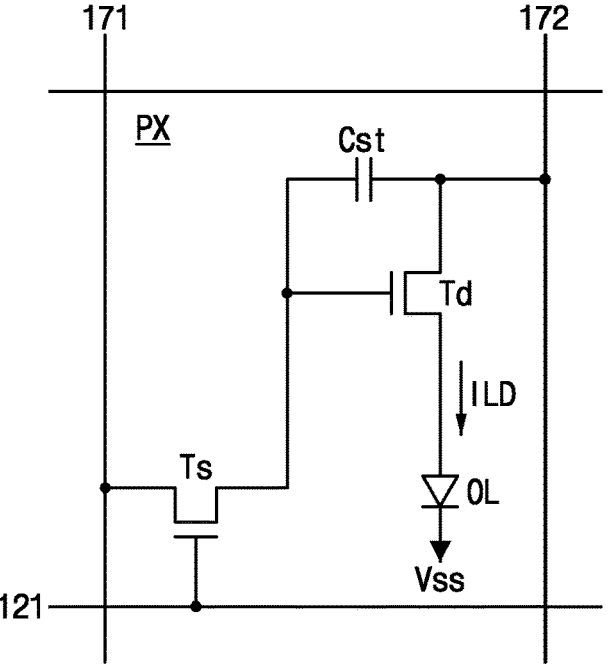
FIG. 2 is a schematic diagram of an equivalent circuit diagram of the pixel included in the display device of FIG. 1.

FIG. 2 is a schematic diagram of an equivalent circuit diagram of the pixel included in the display device of FIG. 1.

Referring to FIGS. 1 and 2, the display device 1000 of the disclosure may include a pixel PX connected to signal lines. The pixel PX may be any one of the red pixel R, the green pixel G, and the blue pixel B of FIG. 1.

The signal lines may include a scan signal line 121 capable of transmitting a gate signal (or a scan signal), a data line 171 capable of transmitting a data signal, a driving voltage line 172 capable of transmitting a driving signal, and the like within the spirit and the scope of the disclosure.

The scan signal line 121 may be arranged or disposed in a row direction. The scan signal line 121 may include lines parallel to each other.

The data line 171 may be arranged or disposed in a column direction. The data line 171 may include lines parallel to each other.

The driving voltage line 172 may be arranged or disposed in the row direction. By way of example, the driving voltage line 172 may be arranged or disposed in the column direction. The driving voltage line 172 may include lines parallel to each other in the row direction or the column direction. By way of example, the driving voltage line 172 may be arranged or disposed in a mesh form. The driving voltage line 172 may include the lines parallel to each other in the column direction and the lines parallel to each other in the row direction intersecting the column direction.

The pixel PX may include a switching transistor Ts, a driving transistor Td, an organic light emitting element OL, and the like within the spirit and the scope of the disclosure.

The switching transistor Ts may include an input terminal, an output terminal, and a control terminal. The input terminal may be connected to the data line 171, the output terminal may be connected to the driving transistor Td, and the control terminal may be connected to the scan signal line 121. Accordingly, the switching transistor Ts may transmit the data signal received from the data line 171 to the driving transistor Td in response to the scan signal received from the scan signal line 121.

The driving transistor Td may also include an input terminal, an output terminal, and a control terminal. The input terminal may be connected to the driving voltage line 172, the output terminal may be connected to the organic light emitting element OL, and the control terminal may be connected to the switching transistor Ts. Accordingly, the driving transistor Td may flow an output current ILD that varies depending on a magnitude of a voltage applied between the control terminal and the output terminal (of the driving transistor Td).

A storage capacitor Cst may be further included between the control terminal and the input terminal of the driving transistor Td.

The storage capacitor Cst may charge the data signal applied to the control terminal of the driving transistor Td to hold the voltage even after the switching transistor Ts is turned off.

In an embodiment, the organic light emitting element OL may be a light emitting device including an organic material. The organic light emitting element OL may include a pixel electrode (for example, a pixel electrode 190 of FIG. 3) connected to the output terminal of the driving transistor Td and a common electrode (for example, a common electrode 270 of FIG. 3) connected to a common voltage Vss.

The organic light emitting element OL may display an image by emitting light of different intensities according to the output current ILD of the driving transistor Td. The organic light emitting element OL may include the organic material capable of emitting at least one of red, green, and blue light.

The switching transistor Ts and the driving transistor Td may be n-channel field effect transistors (FETs), but at least one of them may be a p-channel field effect transistor.

A connection relationship between the switching transistor Ts, the driving transistor Td, the storage capacitor Cst, and the organic light emitting element OL may be changed.

8

Figure 3:
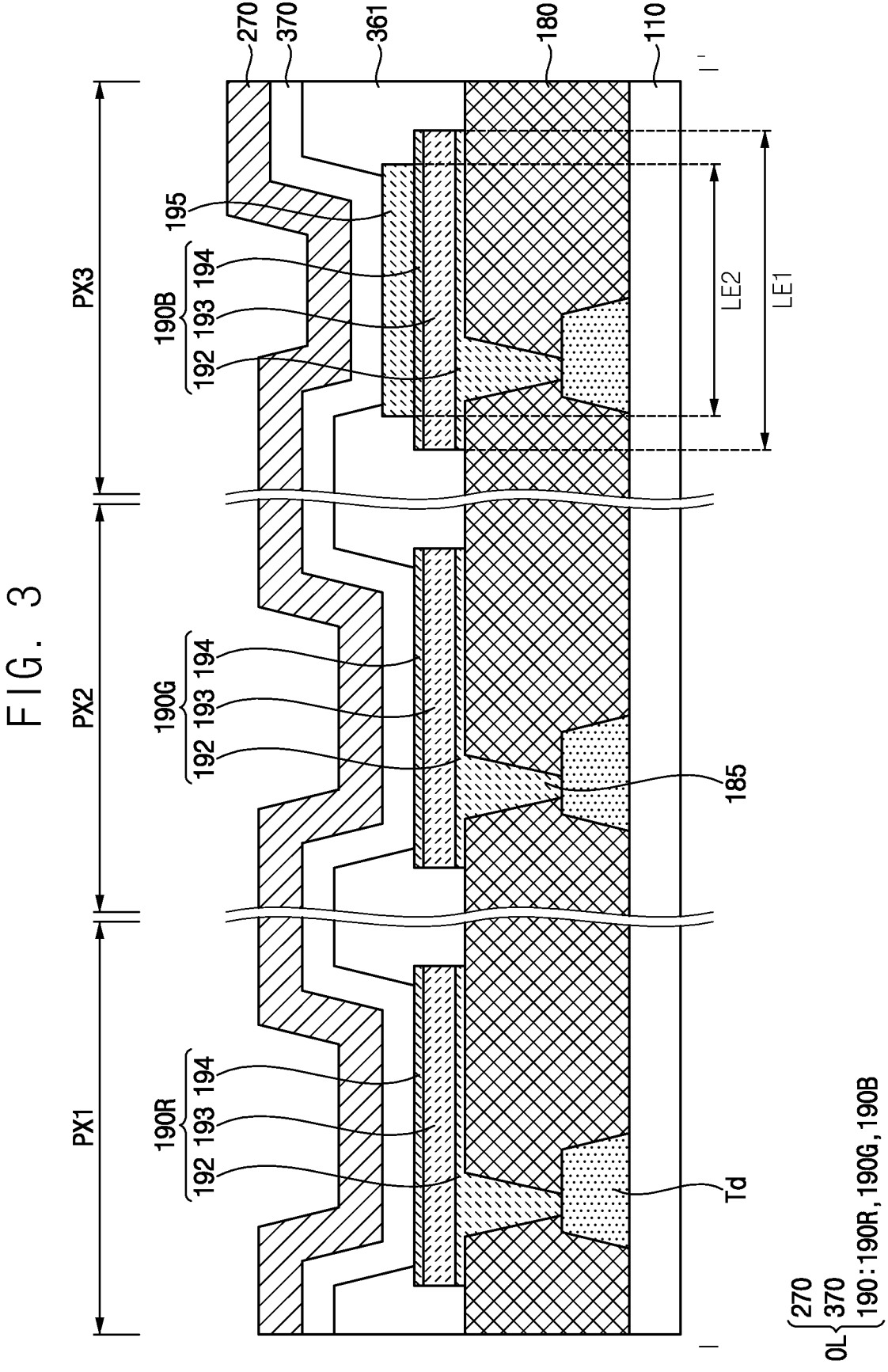
FIG. 3 is a schematic cross-sectional view taken along line I-I' of FIG. 1.
Figure 4:
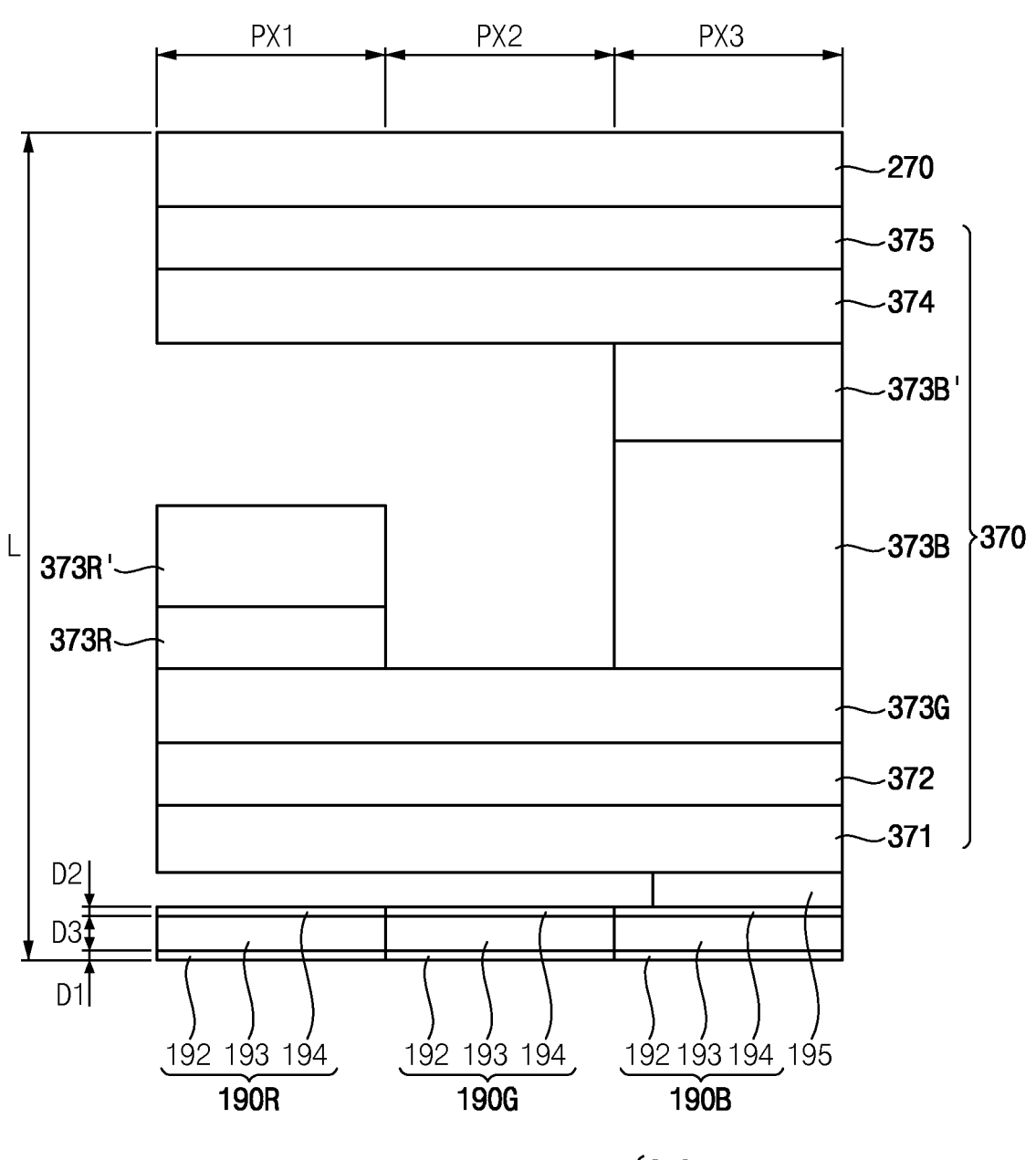
FIG. 4 is a schematic view of the organic light emitting element of FIG. 3.

FIG. 3 is a schematic cross-sectional view taken along line I-I' of FIG. 1, and FIG. 4 is a schematic view of the organic light emitting element of FIG. 3.

Referring to FIGS. 3 and 4, the display device (for example, the display device 1000 of FIG. 1) according to the disclosure may include a substrate 110, the driving transistor Td, a planarization layer 180, and the organic light emitting element OL.

The display device (or substrate 110) may include a first pixel area PX1, a second pixel area PX2, and a third pixel area PX3. Each of the first to third pixel areas PX1, PX2, and PX3 may be a pixel area of any one of the red pixel R, the green pixel G, and the blue pixel B of FIG. 1. For example, the first pixel area PX1 may be an area where the red pixel R is disposed. The second pixel area PX2 may be an area where the green pixel G is disposed. The third pixel area PX3 may be an area where the blue pixel B is disposed.

The substrate 110 may include a glass substrate, a quartz substrate, or a plastic substrate. For example, in case that the substrate 110 is the plastic substrate, the substrate 110 may include polymer resins such as polyethersulphone (PES), polyacrylate (PAR), polyetherimide (PEI), Polyethylene naphthalate (PEN), polyethylene terephthalate (PET), poly-phenylene sulfide (PPS), polyarylate (PAR), polyimide (PI), polycarbonate (PC), cellulose acetate propionate (CAP), and the like within the spirit and the scope of the disclosure. These may be used alone or in combination with each other.

The substrate 110 may have a single-layer structure. By way of example, the substrate 110 may have a multi-layer structure including two layers including the polymer resins and a barrier layer including an inorganic material disposed between the two layers.

The driving transistor Td may be disposed on the substrate 110. A detailed description of the driving transistor Td is equal to described with reference to FIG. 2. The signal lines, the switching transistor Ts, and the like may be further disposed on the substrate 110.

The planarization layer 180 may be disposed on the driving transistor Td. The planarization layer 180 may include inorganic or organic materials. An uppermost layer included in the planarization layer 180 may include the organic material. Accordingly, an upper surface of the planarization layer 180 may be flat. A contact hole 185 exposing a portion of the driving transistor Td may be formed in the planarization layer 180.

The organic light emitting element OL may be disposed on the planarization layer 180. As shown in FIG. 4, the organic light emitting element OL may include the pixel electrode 190, a thickness compensation layer 195, a light emitting layer 370, and the common electrode 270.

Each of A first pixel electrode 190R, a second pixel electrode 190G, and a third pixel electrodes 190B may be formed on the substrate 110. For example, each of the first pixel electrode 190R, the second pixel electrode 190G, and the third pixel electrode 190B may be formed on the planarization layer 180. Hereinafter, for convenience of description, the first pixel electrode 190R, the second pixel electrode 190G, and the third pixel electrode 190B are also referred to as the pixel electrode 190.

The pixel electrode 190 may be disposed on the planarization layer 180. For example, the first pixel electrode 190R may overlap (or may be disposed in) the first pixel area PX1. The second pixel electrode 190G may overlap the second pixel area PX2. The third pixel electrode 190B may overlap the third pixel area PX3.

The pixel electrode 190 may have a multi-layer structure including conductive layers. For example, a first transparent oxide layer 192 may be disposed on the substrate 110. For example, the first transparent oxide layer 192 may be disposed on the planarization layer 180. A metal layer 193 may be disposed on the first transparent oxide layer 192. A second transparent oxide layer 194 may be disposed on the metal layer 193. By way of example, the pixel electrode 190 may have a single-layer structure.

In an embodiment, in case that the pixel electrode 190 has the multi-layer structure, the pixel electrode 190 may include the first transparent oxide layer 192, the metal layer 193 and the second transparent oxide layer 194. For example, the first pixel electrode 190R may include the first transparent oxide layer 192, the metal layer 193 and the second transparent oxide layer 194. The second pixel electrode 190G may include the first transparent oxide layer 192, the metal layer 193 and the second transparent oxide layer 194. The third pixel electrode 190B may include the first transparent oxide layer 192, the metal layer 193 and the second transparent oxide layer 194.

The first transparent oxide layer 192 and the second transparent oxide layer 194 may include a transparent conductive oxide or the like within the spirit and the scope of the disclosure. For example, the transparent conductive oxide may include indium tin oxide (ITO), indium zinc oxide (IZO), and the like within the spirit and the scope of the disclosure. These may be used alone or in combination with each other. The first transparent oxide layer 192 and the second transparent oxide layer 194 may include substantially a same material or a similar material. By way of example, the first transparent oxide layer 192 and the second transparent oxide layer 194 may include different materials.

The first transparent oxide layer 192 and the second transparent oxide layer 194 may be disposed on and/or under or below the metal layer 193, respectively. The first transparent oxide layer 192 and the second transparent oxide layer 194 may improve adhesion between other layers and the metal layer 193. The first transparent oxide layer 192 and the second transparent oxide layer 194 may prevent corrosion of the metal layer 193. For example, the first transparent oxide layer 192 may be disposed on the metal layer 193 and the second transparent oxide layer 194 may be disposed under or below the metal layer 193. The first transparent oxide layer 192 may be omitted.

The metal layer 193 may include a metal having high reflectance or an alloy thereof. For example, the metal having high reflectivity may include gold, silver, aluminum, platinum, nickel, and the like within the spirit and the scope of the disclosure. These may be used individually or in combination with each other.

A thickness D3 of the metal layer 193 may be greater than a thickness D1 of the first transparent oxide layer 192 and a thickness D2 of the second transparent oxide layer 194. Accordingly, light may be reflected from the metal layer 193. For example, each of the thickness D1 of the first oxide layer 192, the thickness D2 of the second transparent oxide layer 194, and the thickness D3 of the metal layer 193 may be about 70 Å, about 100 Å, and about 1000 Å.

The pixel electrode 190 may be electrically connected to the driving transistor Td through the contact hole 185 penetrating the planarization layer 180. For example, in case that the pixel electrode 190 is electrically connected to the driving transistor Td through the contact hole 185 penetrating the planarization layer 180, the pixel electrode 190 may receive the voltage from the driving transistor Td.

The pixel electrode 190 may include a conductive material such as a metal, an alloy, a conductive metal nitride, a conductive metal oxide, or a transparent conductive material. These may be used alone or in combination with each other.

The pixel electrode 190 may be an anode electrode. For example, each of the first pixel electrodes 190R, the second pixel electrode 190G, and the third pixel electrode 190B may be the anode electrode. In an embodiment, the thickness compensation layer 195 may include a material having a work function of about 4.7 electronvolt (eV) or more. For example, the thickness compensation layer 195 having an optimized structure may include Zn-containing ITO (for example, Z-ITO). The Z-ITO may include $ZnO_x$, $InO_x$, $SnO_x$, and the like within the spirit and the scope of the disclosure. The $ZnO_x$ may be ZnO and/or $ZnO_2$.

In an embodiment, a content of $ZnO_x$ in the Z-ITO may be about 50 weight percent (wt. %) or more and about 90 weight percent (wt. %) or less. In case that the content of $ZnO_x$ is less than about 50 weight percent (wt. %), a selectivity with ITO disposed under or below may be small, and an ITO thin film portion may crystallize at the edge of the sputter equipment, resulting in etching residue. On the other hand, in case that the content of $ZnO_x$ exceeds about 90 weight percent (wt. %), it (the pixel electrode 190) may be difficult to serve as the anode electrode due to an increase in resistivity.

The thickness compensation layer 195 may be positioned on any one of the first pixel electrode 190R, the second pixel electrode 190G, and the third pixel electrode 190B. In an embodiment, the thickness compensation layer 195 may be disposed on the third pixel electrode 190B. The thickness compensation layer 195 may overlap a third light emitting layer 370B to be described later.

In an embodiment, a width LE2 of the thickness compensation layer 195 may be smaller than a width LE1 of the third pixel electrode 190B. In the case of the organic light emitting display device 1000 according to the disclosure, a differential anode structure including the thickness compensation layer 195 may be formed using one mask. Accordingly, the width LE2 of the thickness compensation layer 195 may be smaller than the width LE1 of the third pixel electrode 190B. To this end, an etchant having an etch selectivity of the thickness compensation layer 195 greater than an etch selectivity of the second transparent oxide layer 194 may be used. A detailed description of the etch selectivity of the thickness compensation layer 195 and the etch selectivity of the second transparent oxide layer 194 will be described later in a method of manufacturing (or providing) the organic light emitting display device with reference to FIGS. 5 to 15.

For convenience of description, it has been described that the thickness compensation layer 195 is positioned on the third pixel electrode 190B as shown in FIGS. 3 and 4, but the disclosure may not be limited thereto. The thickness compensation layer 195 may overlap the first pixel area PX1 or the second pixel area PX2. For example, the thickness compensation layer 195 may be disposed on the first pixel electrode 190R, or the thickness compensation layer 195 may be disposed on the second pixel electrode 190G.

A pixel defining layer 361 may be disposed on the substrate 110. For example, the pixel defining layer 361 may be disposed on the pixel electrode 190.

The pixel defining layer 361 may define a pixel opening exposing the pixel electrode 190. For example, the pixel defining layer 361 may be disposed to expose an upper surface of the first pixel electrode 190R, an upper surface of the second pixel electrode 190G, and an upper surface of the third pixel electrode 190B.

The pixel defining layer 361 may include an organic material. In an embodiment, the pixel defining layer 361 may include a photoresist, a polyacryl-based resin, a polyimide-based resin, a polyamide-based resin, a siloxane-based resin, an acrylic-based resin, an epoxy-based resin, and the like within the spirit and the scope of the disclosure. These may be used alone or in combination with each other.

Each of a first light emitting layer 370R, a second light emitting layer 370G, and the third light emitting layer 370B may be disposed on the first pixel electrode 190R, the second pixel electrode 190G, and the third pixel electrode 190B exposed by the pixel opening. Hereinafter, for convenience of description, the first to third light emitting layers 370R, 370G, and 370B are also referred to as the light emitting layer 370, and a first organic material layer 373R, a second organic material layer 373G, and a third organic material layer 373B are also referred to as an organic material layer 373.

The light emitting layer 370 may include the organic material layer 373 and a functional layer. The first light emitting layer 370R may include the first organic material layer 373R and the functional layer, the second light emitting layer 370G may include the second organic material layer 373G and the functional layer, and the third light emitting layer 370B may include the third organic material layer 373B and the functional layer. However, the disclosure may not be limited thereto, and the functional layer may be omitted.

In an embodiment, the organic material layer 373 may include an organic light emitting material. For example, the first organic material layer 373R may include the organic light emitting material emitting a first color light, the second organic material layer 373G may include the organic light emitting material emitting a second color light, and the third organic material layer 373B may include the organic light emitting material emitting light of a third color light. The first color light may be red light, the second color light may be green light different from the first color light, and the third color light may be blue light different from the first color light and the second color light. However, the disclosure may not be limited thereto. The first to third color lights may be different color lights such as red, green, blue, and white, respectively.

In an embodiment, the organic material layer 373 may have a multi-layer structure. By way of example, the organic material layer 373 may have a single-layer structure. In an embodiment, in case that the organic material layer 373 has the multi-layer structure, the organic material layer 373 may have a structure in which blue organic material layers 373B are stacked each other. In an embodiment, the organic material layer 373 may have a structure in which the first to third organic material layers 373R, 373G, and 373B emitting different color lights are stacked each other.

The functional layer may be disposed on and/or under or below the organic material layer 373. For example, the functional layer may include a hole injection layer 371, a hole transport layer 372, an auxiliary layer 373', an electron transport layer 374, and an electron injection layer 375, and the like within the spirit and the scope of the disclosure. Each of the hole injection layer 371 and the electron injection layer 375 may be a layer for enhancing injection each of a hole and an electron. Each of the hole transport layer 372 and the electron transport layer 374 may be a layer for balancing the electron and the hole. The auxiliary layers 373' may include a first auxiliary layer 373R' for assisting red light emission, a second auxiliary layer 373B' for assisting blue light emission, and a green auxiliary layer for assisting green light emission.

In an embodiment, the hole injection layer 371 may be disposed on the first pixel electrode 190R in the first pixel area PX1. For example, the hole injection layer 371 may be disposed on the second transparent oxide layer 194. The hole transport layer 372 may be disposed on the hole injection layer 371. The second organic material layer 373G may be disposed on the hole transport layer 372. The second organic layer 373G may be used as a green common layer (GCL). The second organic material layer 373G used as the green common layer may be disposed under or below the first organic material layer 373R and the third organic material layer 373B, respectively. For example, the first organic material layer 373R may be disposed on the green common layer. The first auxiliary layer 373R' may be disposed on the first organic material layer 373R. The hole transport layer 374 may be disposed on the first auxiliary layer 373R'. The hole injection layer 375 may be disposed on the hole transport layer 374.

The hole injection layer 371 may be disposed on the second pixel electrode 190G in the second pixel area PX2. For example, the hole injection layer 371 may be disposed on the second transparent oxide layer 194. The hole transport layer 372 may be disposed on the hole injection layer 371. The second organic material layer 373G may be disposed on the hole transport layer 372. The hole transport layer 374 may be disposed on the second organic material layer 373G. The hole injection layer 375 may be disposed on the hole transport layer 374.

The hole injection layer 371 may be disposed on the third pixel electrode 190B in the third pixel area PX3. For example, the hole injection layer 371 may be disposed on the thickness compensation layer 195. The hole transport layer 372 may be disposed on the hole injection layer 371. The second organic material layer 373G may be disposed on the hole transport layer 372. The third organic material layer 373B may be disposed on the second organic material layer 373G used as the common layer. The second auxiliary layer 373B' may be disposed on the third organic material layer 373B. The hole transport layer 374 may be disposed on the second auxiliary layer 373B'. The hole injection layer 375 may be disposed on the hole transport layer 374. However, a stacking structure and an order according to embodiments may not be limited thereto.

The common electrode 270 may be disposed on the light emitting layer 370. For example, the common electrode 270 may be disposed on the first to third light emitting layers 370R, 370G, and 370B.

The common electrode 270 may include a semitransparent material. For example, the semitransparent material may include a metal or an alloy thereof. For example, the metal may include gold, silver, aluminum, platinum, nickel, and the like within the spirit and the scope of the disclosure. These may be used individually or in combination with each other.

In an embodiment, the common electrode 270 may have a multi-layer structure. For example, the common electrode 270 may have the multi-layer structure including an upper layer including the metal such as the silver and a lower layer including the alloy such as a magnesium alloy. A resistance of the upper layer may be smaller than a resistance of the lower layer, a work function of the lower layer may be small, and an electron injection rate of the lower layer may be relatively greater than an electron injection rate of the upper layer. By way of example, the common electrode 270 may have a single-layer structure.

In an embodiment, the common electrode 270 may be a cathode electrode. The common electrode 270 may transmit the common voltage (for example, the common voltage Vss of FIG. 2).

Each of the first to third color lights may resonate between the anode electrode and the cathode electrode. In an embodiment, the first color light may be resonated between the metal layer 193 and the common electrode 270. The first color light may have a first resonance. The second color light may resonate between the metal layer 193 and the common electrode 270. The second color light may have the first resonance. The third color light may resonate between the metal layer 193 and the common electrode 270. The differential anode structure may be included between the metal layer 193 and the common electrode 270. For example, the thickness compensation layer 195 may be included between the metal layer 193 and the common electrode 270. The third color light may have a second resonance. A resonance mode (for example, the first resonance and the second resonance) may be defined as the number of half-wavelength waves in each direction within a cavity (for example, a space between the metal layer 193 and the common electrode 270). For example, the second resonance may further include the half-wavelength than the first resonance.

In an embodiment, the organic light emitting display device (for example, the display device 1000) may display the image by transmitting the light upward through the substrate 110.

In case that electric energy is injected into the light emitting material of the light emitting layer 370, the electrons and the holes may meet to generate light. The light may be reflected or transmitted at various interfaces included in the organic light emitting display device.

The light emitted from the light emitting layer 370 toward the substrate 110 may pass through the thickness compensation layer 195 and the second transparent oxide layer 194 to reach the metal layer 193. The light reflected from the metal layer 193 may be reflected to the common electrode 270. The light reflected from the common electrode 270 may be reflected again to the metal layer 193. The reflected lights passing between the metal layer 193 and the common electrode 270 may interfere with each other. In case that constructive interference having amplitude greater than an original wavelength (of the light emitted from the light emitting layer 370) occurs, the resonance may occur.

The resonance phenomenon may occur according to a thickness and a refractive index of each of various layers between the metal layer 193 and the common electrode 270. For example, the thickness and the material (having the refractive index capable of causing the resonance) of each of the various layers between the metal layer 193 and the common electrode 270 may be appropriately selected to enhance the light (to display the image) having a wavelength corresponding to each basic color.

In an embodiment, the thickness compensation layer 195 may be introduced to generate an optimal resonance frequency at which the light emitting material capable of causing the resonance.

For example, the thickness D1 of the first transparent oxide layer 192, the thickness D2 of the second transparent oxide layer 194, and the thickness D3 of the metal layer 193 overlapping the first pixel area PX1 may be about 70 Å, about 100 Å, and about 1000 Å respectively. The thickness D1 of the first transparent oxide layer 192, the thickness D2 of the second transparent oxide layer 194, and the thickness D3 of the metal layer 193 overlapping the second pixel area PX2 may be also about 70 Å, about 100 Å, and about 1000

Å respectively. On the other hand, the thickness D1 of the first transparent oxide layer 192, the thickness D2 of the second transparent oxide layer 194, the thickness D3 of the metal layer 193, and the thickness of the thickness compensation layer 195 overlapping the third pixel area PX3 may be about 70 Å, about 100 Å, about 1000 Å, and about 850 Å respectively.

Accordingly, the resonance phenomenon may occur in a visible light having a wavelength of about 380 nm or more, and about 780 nm or less. In other words, the light generated from the light emitting layer 370 may be viewed more brightly. However, the disclosure may not be limited thereto. The thicknesses D1, D2, and D3 may be changed.

In an embodiment, an optical path length L between the metal layer 193 and the common electrode 270 may be the same for each of the red pixel R, the green pixel G, and the blue pixel B of FIG. 1. In other words, a resonance distance may be adjusted according to an outgoing light wavelength.

In the first pixel area PX1, the optical path length L between the metal layer 193 and the common electrode 270 may be determined by multiplying the thickness and the refractive index of each layer (for example, the hole injection layer 371, the hole transport layer 372, the first organic compound layer 373R, the second organic compound layer 373G, the electron transport layer 374, the electron injection layer 375, etc.).

In the second pixel area PX2, the optical path length L between the metal layer 193 and the common electrode 270 may be determined by multiplying the thickness and the refractive index of each layer (for example, the hole injection layer 371, the hole transport layer 372, the second organic compound layer 373G, the hole transport layer 374, the electron injection layer 375, etc.)).

In the third pixel area PX3, the optical length L between the metal layer 193 and the common electrode 270 may be determined by multiplying the thickness and the refractive index of each layer (for example, the thickness compensation layer 195, the hole injection layer 371, the hole transport layer 372, the second organic material layer 373G, the third organic material layer 373B, the electron transport layer 374, the electron injection layer 375, etc.).

For convenience of description, the thickness compensation layer 195 may be disposed on the third pixel electrode 190B as shown in FIGS. 3 and 4. But the disclosure may not be limited thereto. The thickness compensation layer 195 may be also disposed on the first pixel electrode 190R and the second pixel electrode 190G. Accordingly, the light having a wavelength and color purity within a desired range for each basic color may be provided, light efficiency of the display device may be increased, and color reproducibility may be improved.

In an embodiment, the display device (for example, the display device 1000 of FIG. 1) may display the image by transmitting the light downward through the substrate 110.

The metal layer 193 may include the semitransparent material. For example, the semitransparent material may include the metal or the alloy thereof. For example, the metal may include gold, silver, aluminum, platinum, nickel, and the like within the spirit and the scope of the disclosure. These may be used individually or in combination with each other.

The common electrode 270 may include the reflective material. For example, the reflective material may include the metal or the alloy of the metal. For example, the metal may include gold, silver, aluminum, platinum, nickel, and the like within the spirit and the scope of the disclosure. These may be used individually or in combination with each other.

On the other hand, the display device may further include the organic material (the organic light emitting material) emitting a basic color different from the red, green and the blue.

Figure 5:
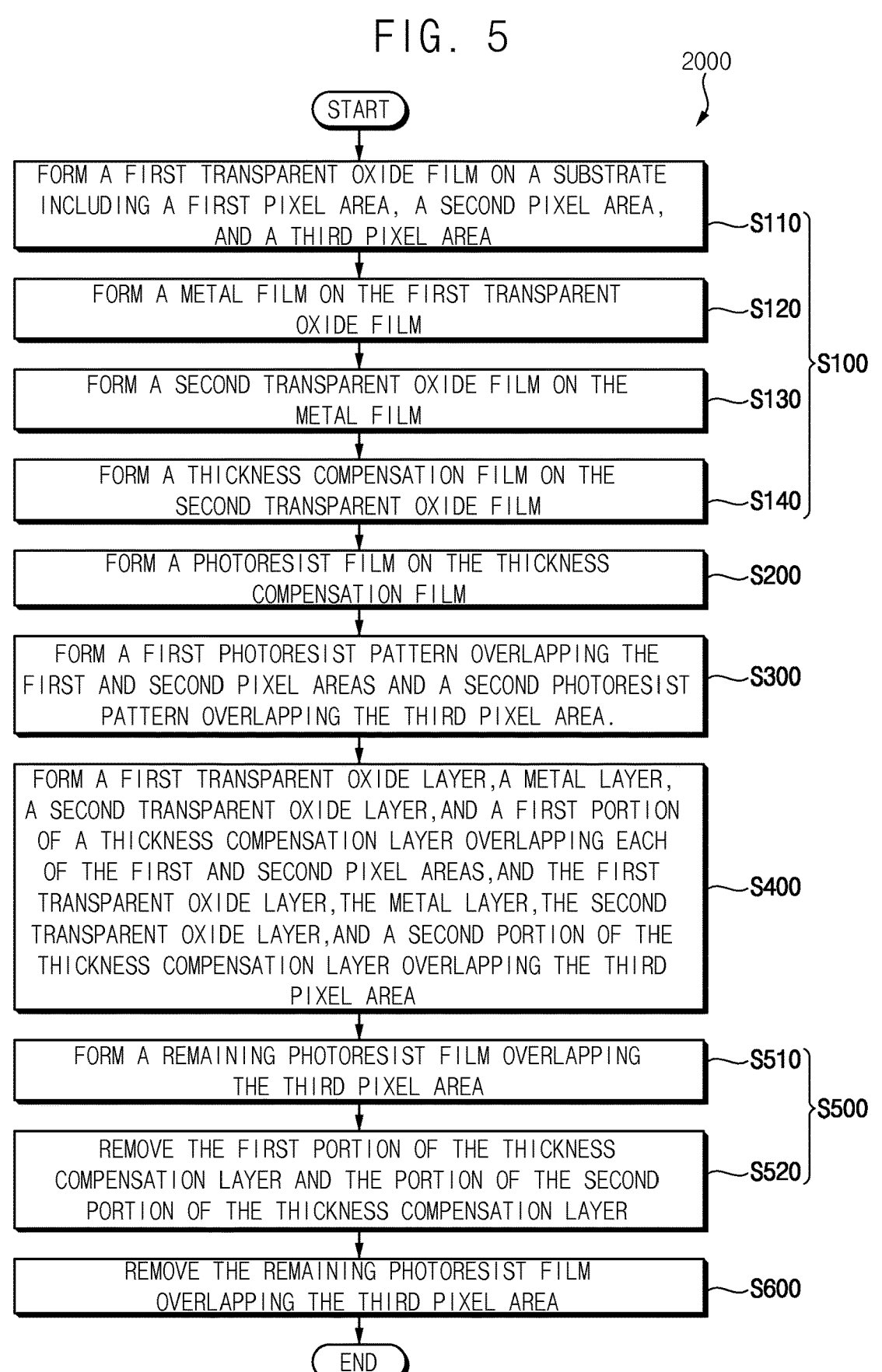
FIG. 5 is a flowchart of a method of manufacturing (or providing) an organic light emitting display device according to embodiments.
Figure 6:
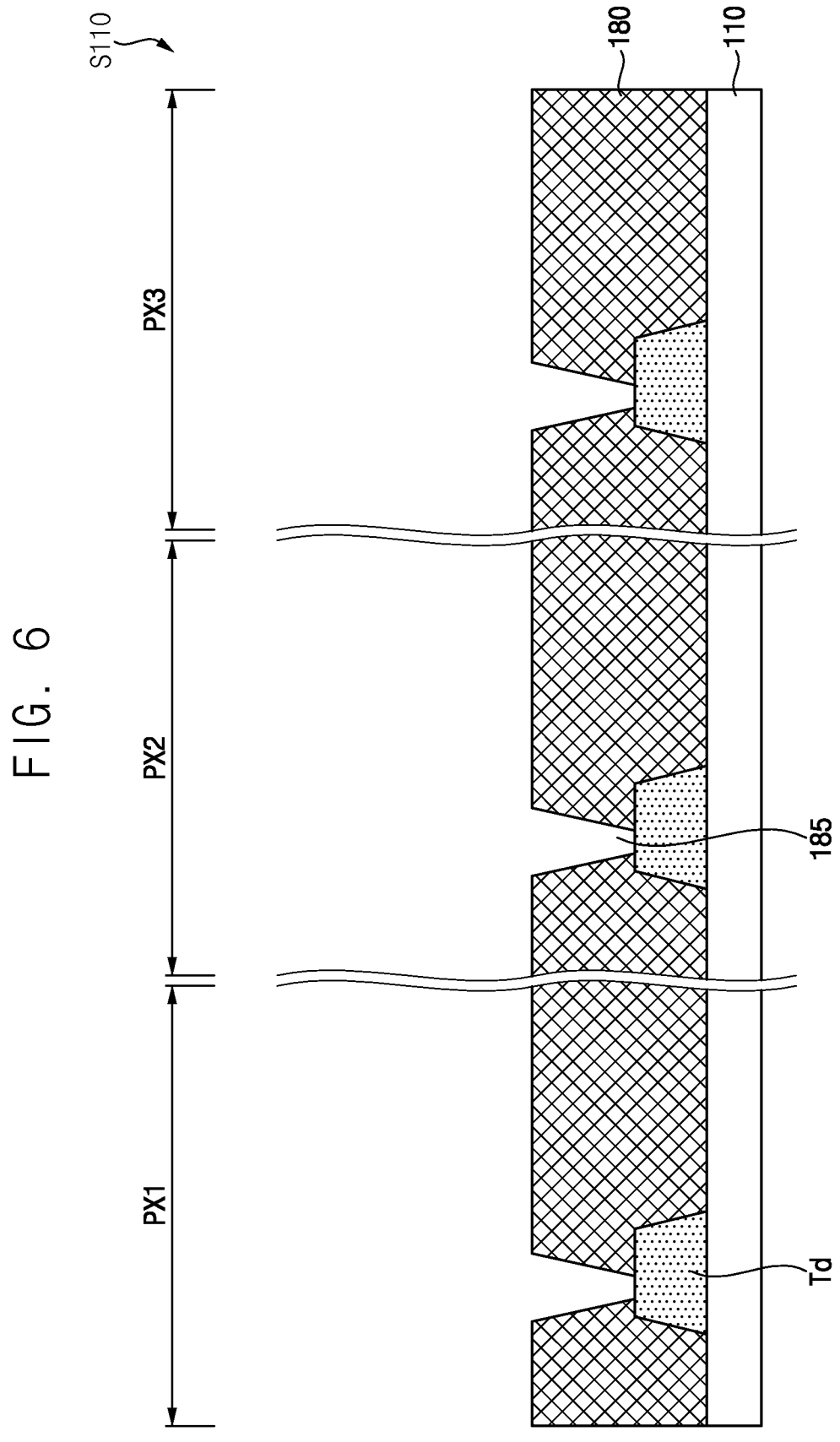
FIGS. 6 to 17 are schematic cross-sectional views for illustrating a method of manufacturing (or providing) an organic light emitting display device according to an embodiment.
Figure 7:
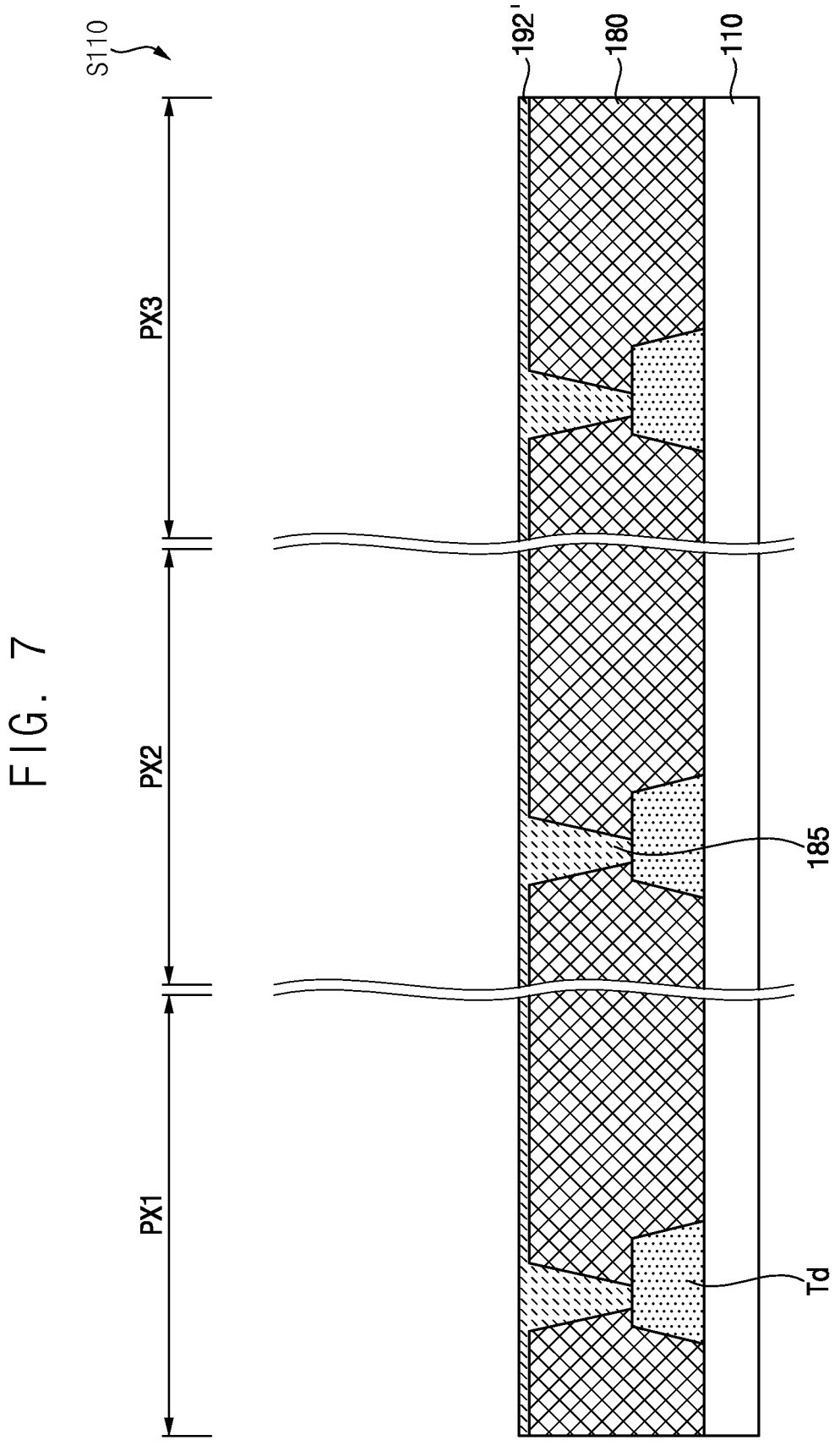
Figure 8:
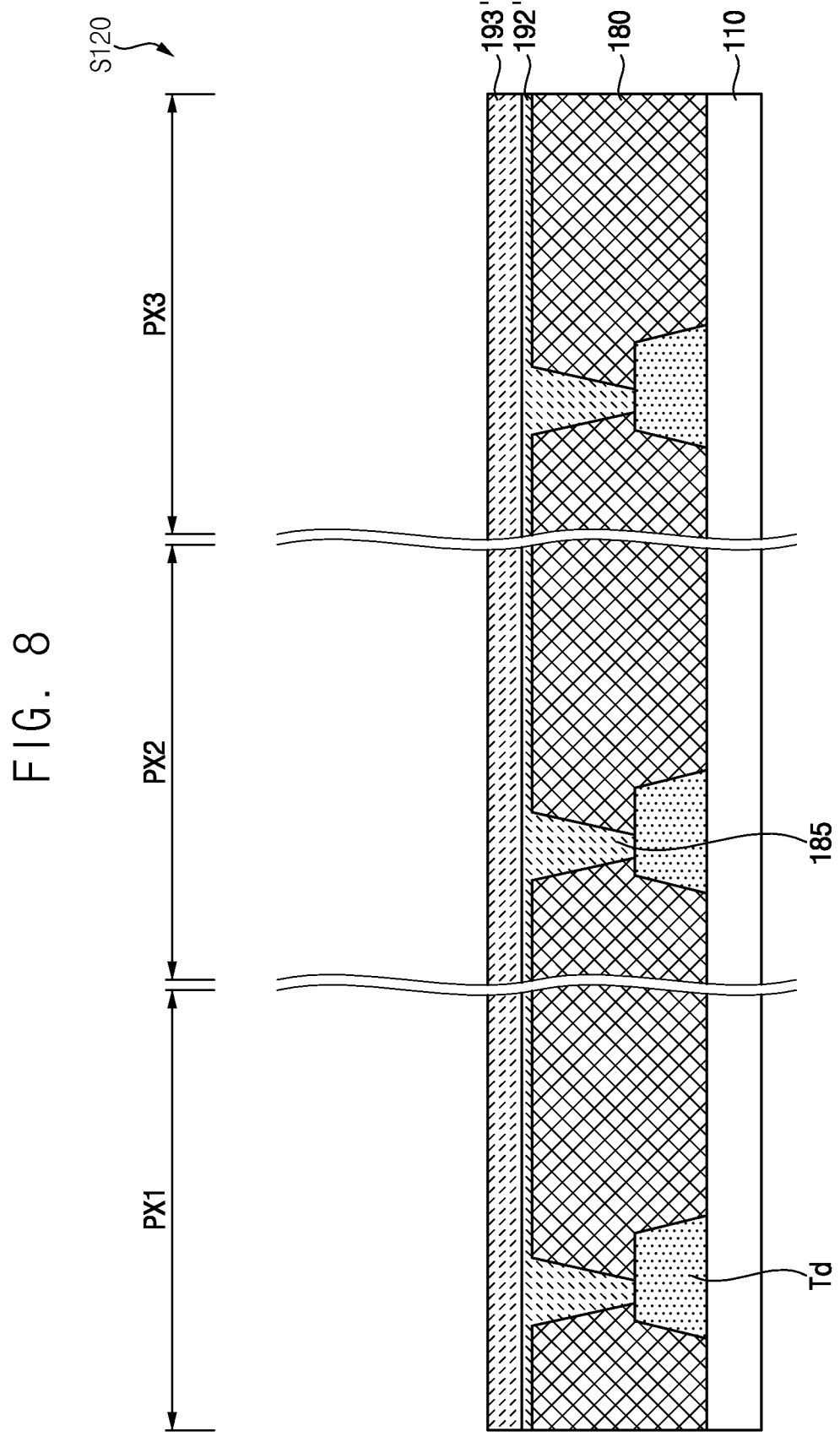
Figure 9:
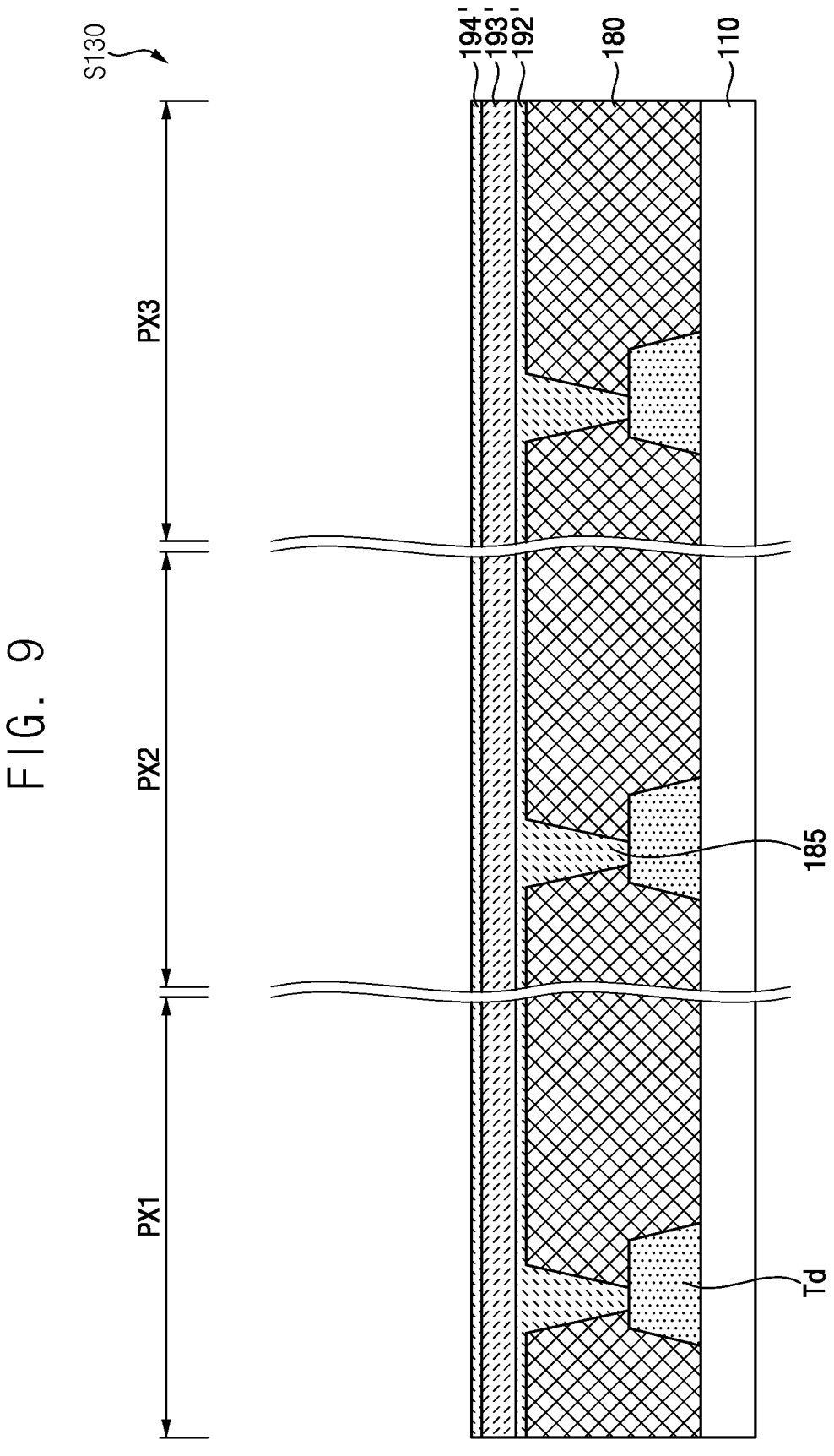
Figure 10:
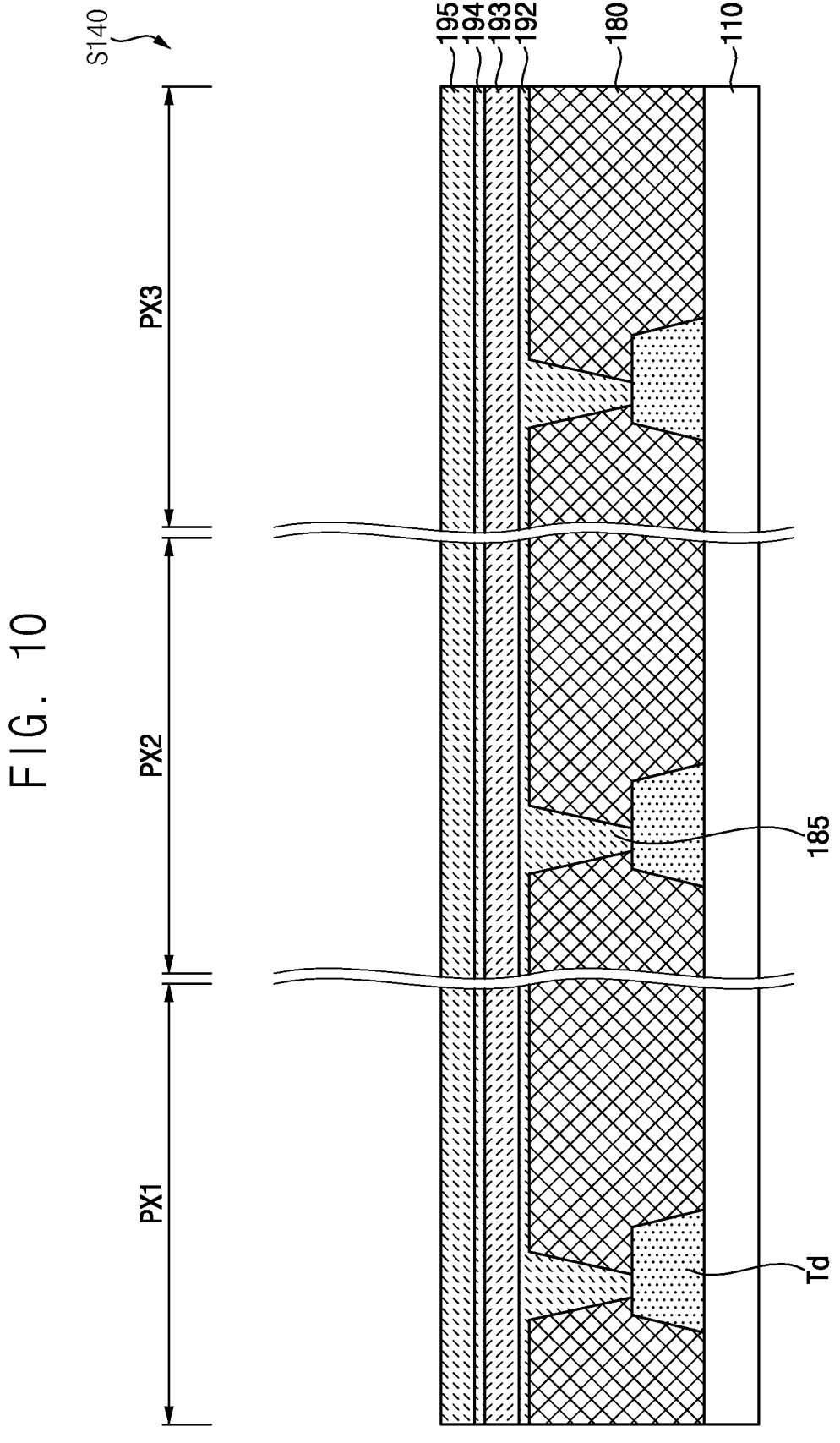

FIG. 5 is a flowchart of a method of manufacturing (or providing) an organic light emitting display device according to embodiments, and FIGS. 6 to 17 are schematic cross-sectional views for illustrating a method of manufacturing (or providing) an organic light emitting display device according to an embodiment.

Hereinafter, descriptions overlapping with those of the display device described above with reference to FIGS. 1 to 4 may be omitted or simplified.

Referring to FIGS. 5 to 17, the method of manufacturing (or providing) the organic light emitting diode display 2000 may include the following steps.

A first transparent oxide film 192', a metal film 193', a second transparent oxide film 194', and a thickness compensation film 195' may be sequentially formed on a substrate 110 including a first pixel area PX1, a second pixel area PX2, and a third pixel area PX3 (S100). A photoresist film PR may be formed on the thickness compensation film 195' (S200). A first photoresist pattern PR1 overlapping the first pixel area PX1 and the second pixel area PX2, and a second photoresist pattern PR2 overlapping the third pixel area PX3 may be formed. Each of the first photoresist pattern PR1 and the second photoresist pattern PR2 may be formed by performing an exposure and a development process using a half-tone mask on the photoresist film PR (S300). A first portion of a thickness compensation layer 195a overlapping each of the first pixel area PX1 and the second pixel area PX2, and a second portion of the thickness compensation layer 195b overlapping the third pixel area PX3, and a first transparent oxide layer 192, a metal layer 193, and a second transparent oxide layer 194 overlapping each of the first pixel area PX1, the second pixel area PX2, and the third pixel area PX3 may be formed. Each of the first transparent oxide layer 192, the metal layer 193, and the second transparent oxide layer 194, the first portion of the thickness compensation layer 195a, and the second portion of the thickness compensation layer 195b may be formed, by performing a primary etching process on the first transparent oxide film 192', the metal film 193', the second transparent oxide film 194', and the thickness compensation film 195' (S400). The method 2000 may also include forming a remaining photoresist film overlapping the third pixel area (S510), removing the first portion of the thickness compensation layer and the portion of the second portion of the thickness compensation layer (S520), collectively, (S500). A remaining photoresist film PRP overlapping the third pixel area PX3 may be removed (S600).

As shown in FIGS. 6 to 10, the first transparent oxide film 192', the metal film 193', the second transparent oxide film 194', and the thickness compensation film 195' may be sequentially formed on the substrate 110 including the first pixel area PX1, the second pixel area PX2, and the third pixel area PX3 (S100). For example, a driving transistor Td and a planarization layer 180 may be formed. A contact hole 185 may be formed in the planarization layer 180. The first transparent oxide film 192', the metal film 193', the second transparent oxide film 194', and the thickness compensation film 195' may be sequentially formed on the thickness compensation layer 195' (S110~S140).

In other words, the first transparent oxide film 192' may be formed on the planarization layer 180 and the first transparent oxide film 192' may fill the contact hole 185 (S110). The metal film 193' may be formed on the first transparent oxide film 192' (S120). The second transparent oxide film 194' may be formed on the metal film 193' (S130). The thickness compensation film 195' may be formed on the second transparent oxide film 194' (S140).

Each of the first transparent oxide film 192', the second transparent oxide film 194', and the thickness compensation film 195' may be formed of a transparent conductive oxide. For example, each of the first transparent oxide film 192' and the second transparent oxide film 194' may be formed of ITO. The thickness compensation film 195' having an optimized structure may be formed of Zn-containing ITO (for example, Z-ITO). The Z-ITO may include $ZnO_x$, $InO_x$, $SnO_x$, and the like within the spirit and the scope of the disclosure. The $ZnO_x$ may be ZnO and/or $ZnO_2$.

Each of first transparent oxide film 192', the second transparent oxide film 194' and the thickness compensation film 195' may be formed by a sputtering process, a chemical vapor deposition process, an atomic layer deposition process, a pulse layer deposition process, a printing process, or the like within the spirit and the scope of the disclosure.

In an embodiment, a content of $ZnO_x$ in the Z-ITO may be about 50 weight percent (wt. %) or more and about 90 weight percent (wt. %) or less. In case that the content of $ZnO_x$ is less than about 50 weight percent (wt. %), a selectivity with ITO disposed under or below may be small, and an ITO thin film portion may crystallize at the edge of the sputter equipment, resulting in etching residue. On the other hand, in case that the content of $ZnO_x$ exceeds about 90 weight percent (wt. %), it (the pixel electrode 190) may be difficult to serve as the anode electrode due to an increase in resistivity.

The metal film 193' may be formed of a reflective metal. For example, the metal film 193' may be formed of Ag.

The metal film 193' may be formed by a sputtering process, a chemical vapor deposition process, an atomic layer deposition process, a pulse layer deposition process, a printing process, or the like within the spirit and the scope of the disclosure.

In a method of manufacturing (or providing) the organic light emitting display device including a differential anode structure according to the comparative example, the differential anode structure was formed using additional mask (for example, using two masks). Accordingly, in the differential anode, an align error occurred, and quality of the organic light emitting display device was deteriorated.

In a method of manufacturing (or providing) of the organic light emitting display device 2000 according to the disclosure, the differential anode structure may be formed using one mask. For example the differential anode structure may be formed by sequentially stacking the first transparent oxide film 192', the metal film 193', the second transparent film 194', and the thickness compensation film 195', and applying a half-tone mask (for example, a half-tone mask HM of FIG. 12).

Figure 11:
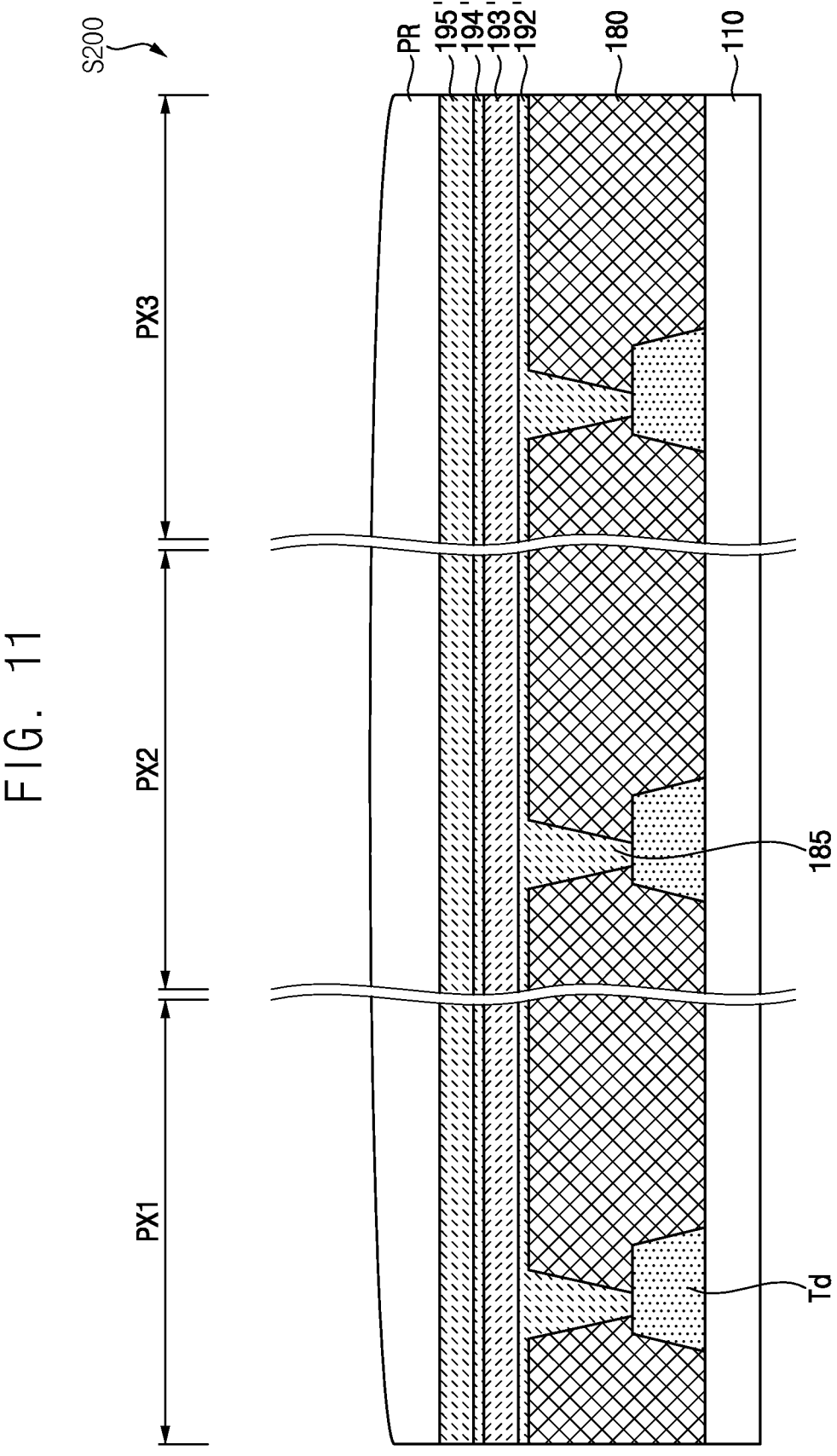

As shown in FIG. 11, the photoresist film PR may be formed on the thickness compensation film 195' (S200).

The photoresist film PR may be formed of one of a positive type in which an irradiated area of ultraviolet (UV) is removed and a negative type in which the irradiated area with the UV is left.

Figure 12:
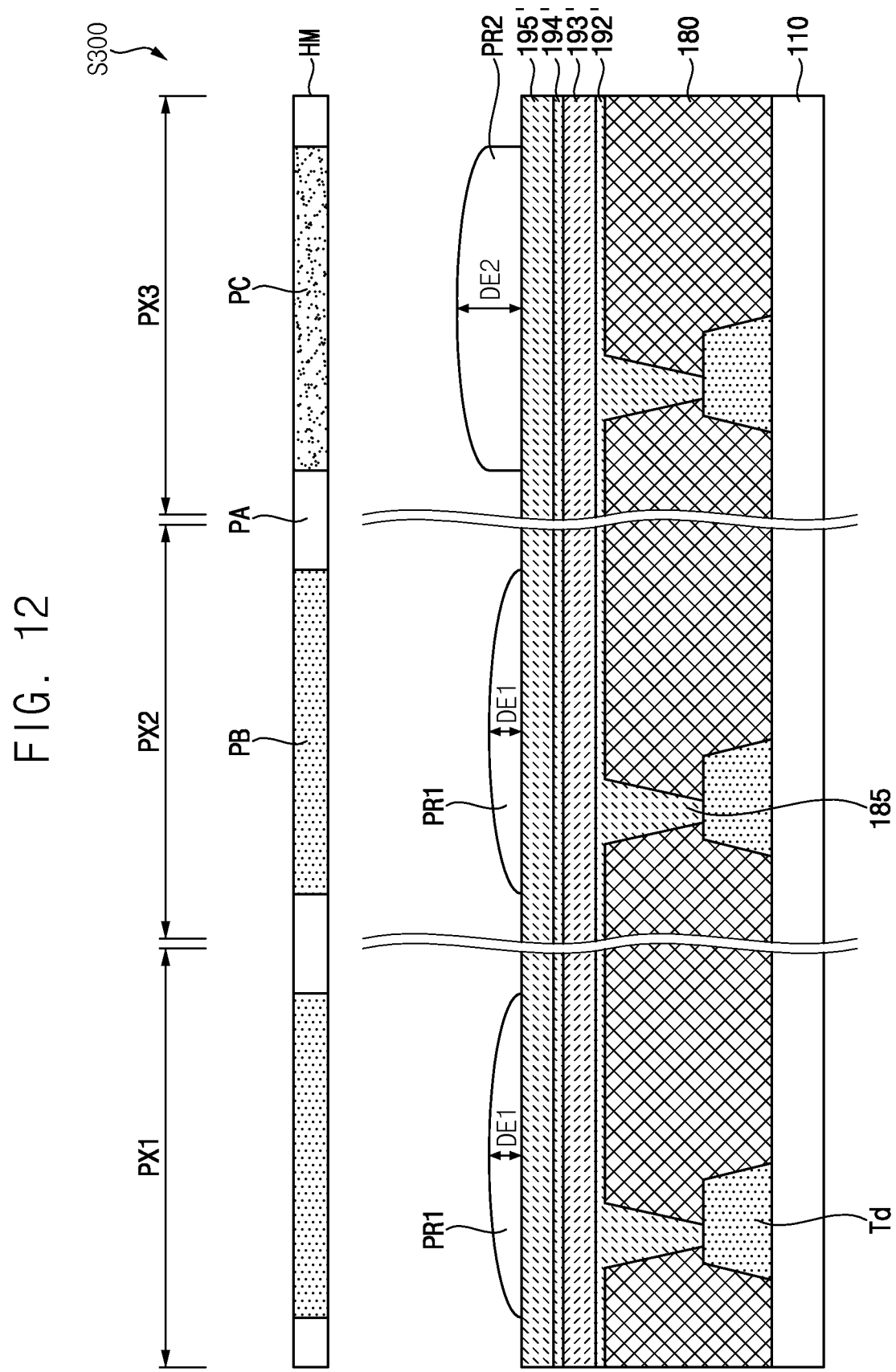

As shown in FIG. 12, the first photoresist pattern PR1 overlapping the first pixel area PX1 and the second pixel area PX2, and the second photoresist pattern PR2 overlapping the third pixel area PX3 may be formed. Each of the first photoresist pattern PR1 and the second photoresist pattern PR2 may be formed by performing the exposure and the development process using the half-tone mask on the photoresist film PR (S300).

The half-tone mask HM The halftone mask HM may include a light transmitting part PA, a semi transmitting part PB, and a light blocking part PC. The semi transmitting part PB may have lower transmittance than the light transmitting part PA. The light blocking part PC may not transmit the light.

In an embodiment, in case that the photoresist film PR is formed using the positive type, the light blocking part PC may overlap the third pixel area PX3, and the semi transmitting part PB may overlap the first to second pixel areas PX1 and PX2.

After irradiating light to the photoresist film PR, the developing process of removing a portion of the exposed photoresist film PR may be performed. In this process, the portion of the exposed photoresist film PR may be removed. However, the form in which the portion of the exposed photoresist film PR is removed may be different from the illustrated embodiment depending on a method and a material used in the development process.

In an embodiment, through the exposure and the development processes, the first photoresist pattern PR1 may have a first thickness DE1, and the second photoresist pattern PR2 may have a second thickness DE2 different from the first thickness DEL In an embodiment, the first thickness DE1 of the first photoresist pattern PR1 may be smaller than the second thickness DE2 of the second photoresist pattern PR2. The first thickness DE1 and the second thickness DE2 may be changed according to an etching speed, an etching selectivity between materials included in the thickness compensation film 195' and the second transparent oxide film 194', and the like within the spirit and the scope of the disclosure.

Figure 13:
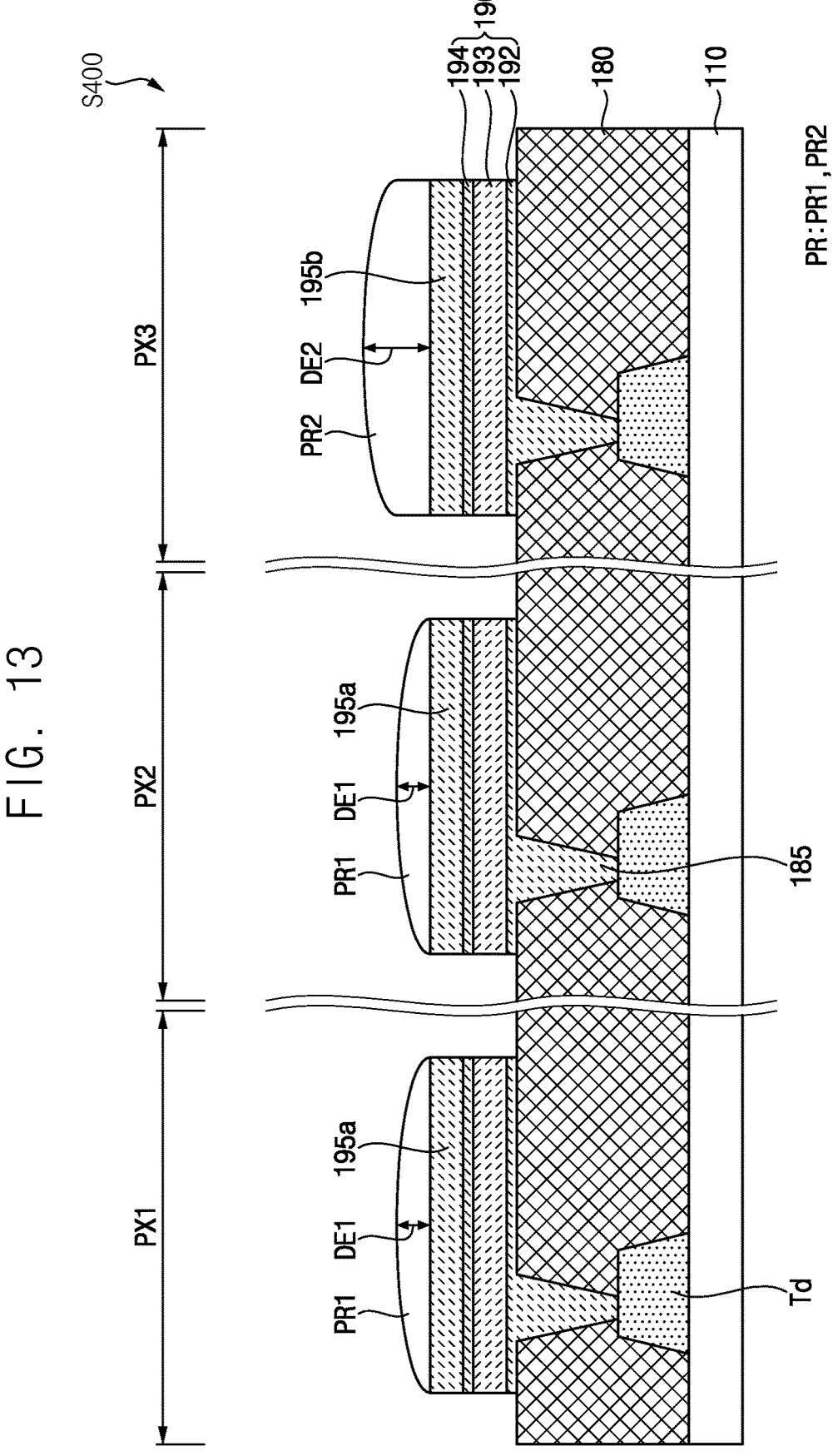

As shown in FIGS. 12 and 13, the first portion of the thickness compensation layer 195a overlapping each of the first pixel area PX1 and the second pixel area PX2, and the second portion of the thickness compensation layer 195b overlapping the third pixel area PX3, and the first transparent oxide layer 192, the metal layer 193, the second transparent oxide layer 194 overlapping each of the first pixel area PX1, the second pixel area PX2, and the third pixel area PX3 may be formed. Each of the first transparent oxide layer 192, the metal layer 193, and the second transparent oxide layer 194, the first portion of the thickness compensation layer 195a, and the second portion of the thickness compensation layer 195b may be formed by performing the primary etching process on the first transparent oxide film 192', the metal film 193', the second transparent oxide film 194', and the thickness compensation film 195' (S400).

In an embodiment, the primary etching process may be a wet etching process.

In an embodiment, while adjusting etching conditions, the first transparent oxide film 192', the metal film 193', the second transparent film 194', and the thickness compensation film 195' may be etched at once. Accordingly, a pre-anode pattern may be formed. The pre-anode pattern may include the first transparent oxide layer 192, the metal layer 193, the second transparent oxide layer 194, and the thickness compensation layer 195 (for example, the first portion of the thickness compensation layer 195a and the second portion of thickness compensation layer 195b), and have a sequentially stacked structure.

Figure 14:
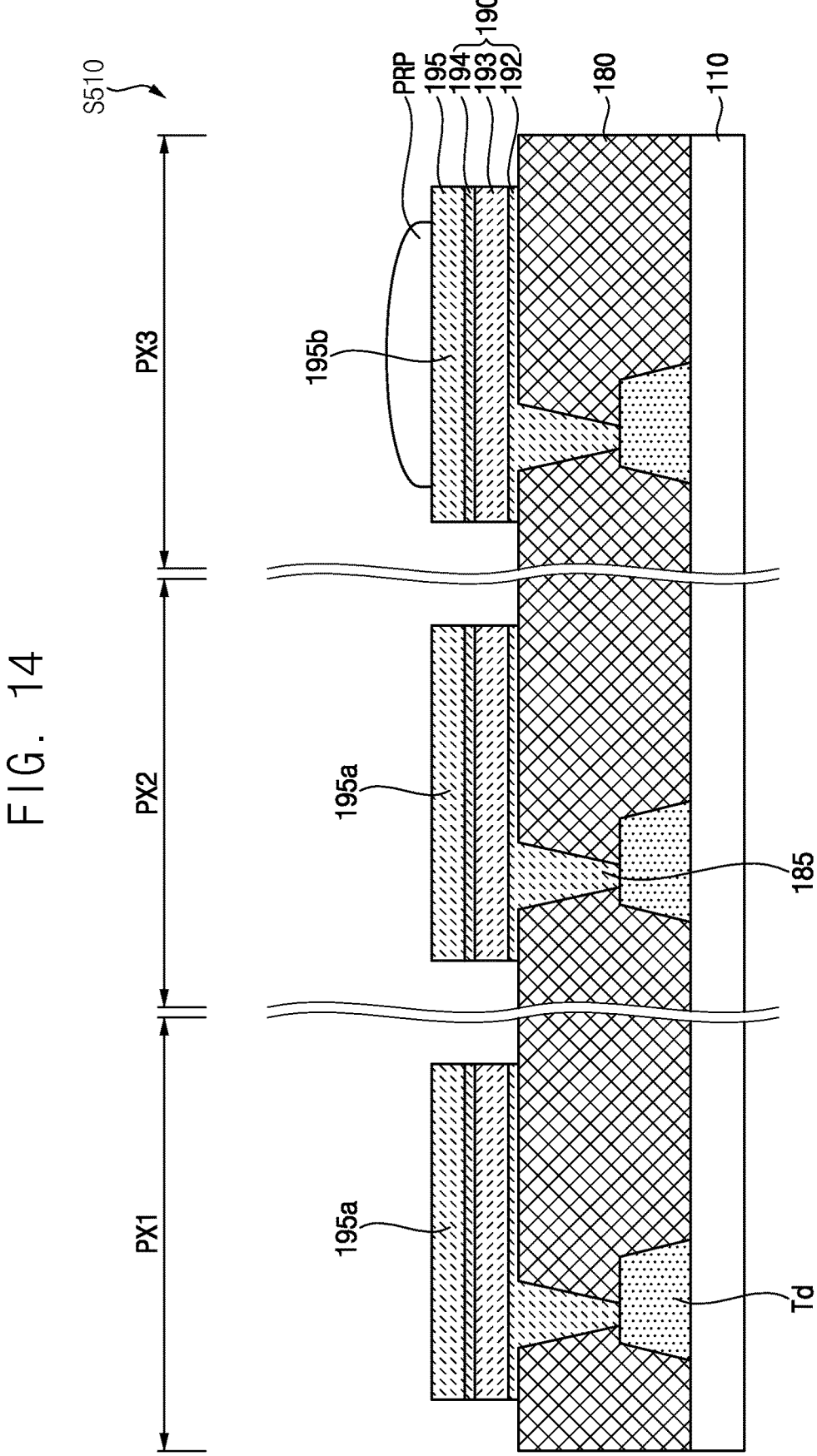
Figure 15:
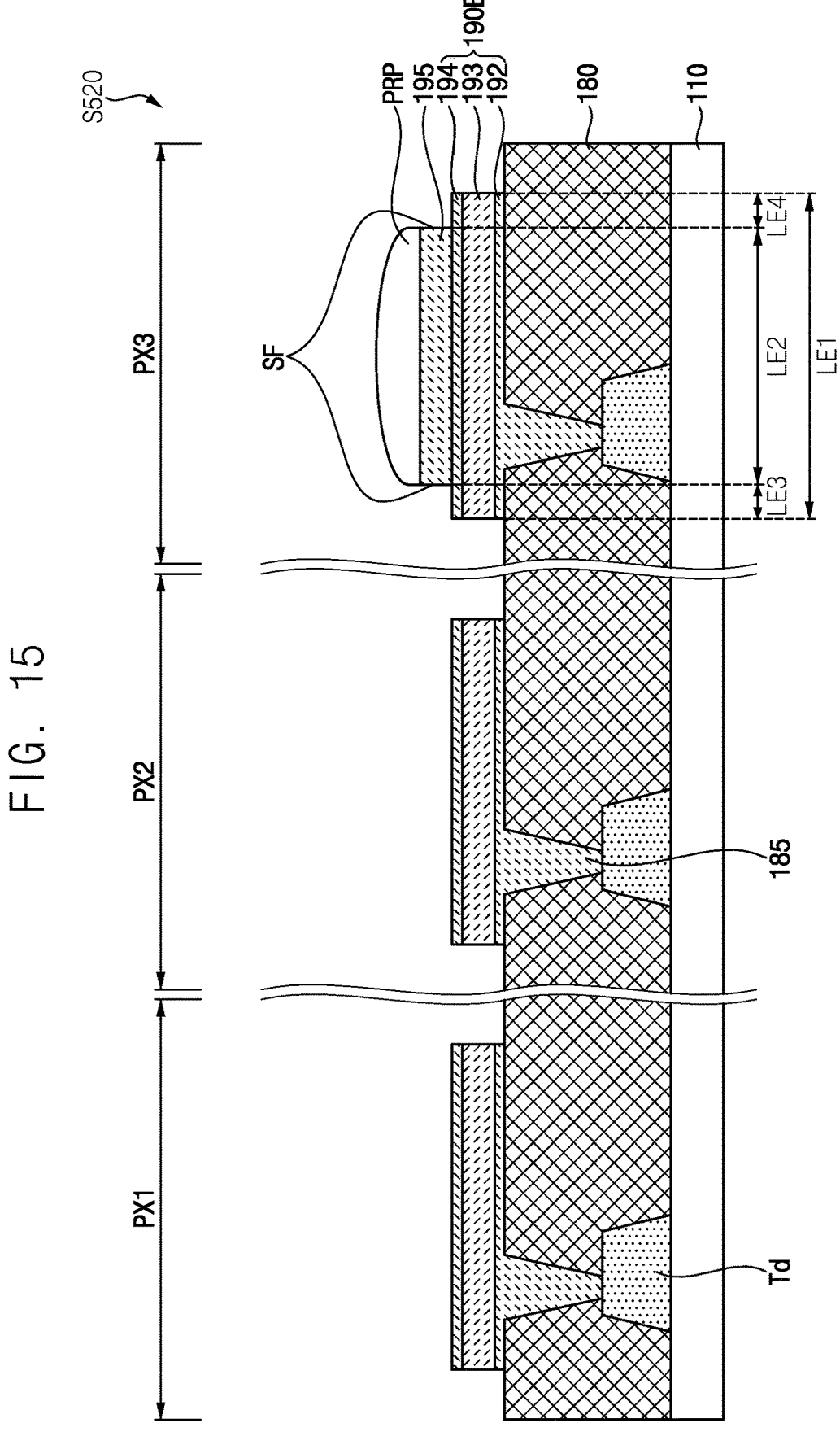

As shown in FIGS. 13 to 15, The first portion of the thickness compensation layer 195a and the portion of the second portion of the thickness compensation layer 195b may be removed (S400). For example, through the ashing process, the first photoresist pattern PR1 and the portion of the second photoresist pattern PR2 may be removed (S510). And, through the secondary etching process, the first portion of the thickness compensation layer 195a and the portion of the second portion of the thickness compensation layer 195b may be removed by the secondary etching process (S520).

First, through the ashing process, an entire first photoresist pattern PR1 may be removed, and the portion of the second photoresist pattern PR2 may be removed (S510).

As described above, the first thickness DE1 of the first photoresist pattern PR1 may be smaller than the second thickness DE2 of the second photoresist pattern PR2. For example, removing the entire first photoresist pattern PR1 and the portion of the second photoresist pattern PR2 through the ashing process, the remaining photoresist film PRP overlapping the third pixel area PX3 may be left only.

And, through the secondary etching process, the first portion of the thickness compensation layer 195a and the portion of the second portion of the thickness compensation layer 195b may be removed by the secondary etching process (S520).

After the removing of the first photoresist pattern PR1, an upper surface of the first portion of the thickness compensation layer 195a overlapping each of the first pixel area PX1 and the second pixel area PX2 may be exposed. By using the etchant, the upper surface of the first portion of the thickness compensation layer 195a overlapping each of the first pixel area PX1 and the second pixel area PX2 may be etched. In this time, the etchant may have the etch selectivity of the thickness compensation layer 195 and the second transparent oxide layer 194 different each other. For example, the etch selectivity of the thickness compensation layer 195 may be greater than the etch selectivity of the second transparent oxide layer 194.

A portion of a side surface of the second portion of the thickness compensation layer 195b may be removed through the secondary etching process. An upper surface of the second portion of the thickness compensation layer 195b overlapping the third pixel area PX3 may be covered by the remaining photoresist film PRP, and may not be etched by the etchant. In the other hand, the side surface intersecting a surface where the second transparent oxide layer 194 and the second portion of the thickness compensation layer 195b meet each other (for example, left and right side surfaces SF of the second portion of the thickness compensation layer 195b) may be exposed and etched by the etchant.

Accordingly, a width LE2 of the thickness compensation layer 195 may be smaller than a width LE1 of the third pixel electrode 190B. The portion of the side surface SF of the second portion of the thickness compensation layer 195b may be etched by using a same mask (for example, the remaining photoresist film PRP). Accordingly, in a cross-sectional view, a first width LE3 and a second width LE4 may be the same. The first width LE3 may be a horizontal distance between a left end of the second transparent oxide layer 194 and a left end of the thickness compensating layer 195. The second width LE4 may be a horizontal distance between a right end of the second transparent oxide layer 194 and a right end of the thickness compensation layer 195.

In an embodiment, the second transparent oxide layer 194 may be formed of ITO, and the thickness compensation layer 195 may be formed of Z-ITO. In an embodiment, the thickness compensation layer 195 may be formed of the Z-ITO. A content of $ZnO_x$ in the Z-ITO may be about 50 weight percent (wt. %) or more, and about 90 weight percent (wt. %) or less.

An etching rate of the Z-ITO may be about 20 times faster than an etching rate of the ITO. Accordingly, while all of the Z-ITO is etched, the ITO formed under or below the Z-ITO may remain. In other words, after the secondary etching process, only the portion of the thickness compensation layer 195 overlapping the third pixel area PX3 may remain. Accordingly, a process of forming the differential anode structure using the additional mask may be omitted, and the align error of the differential anode structure may be prevented.

Figure 16:
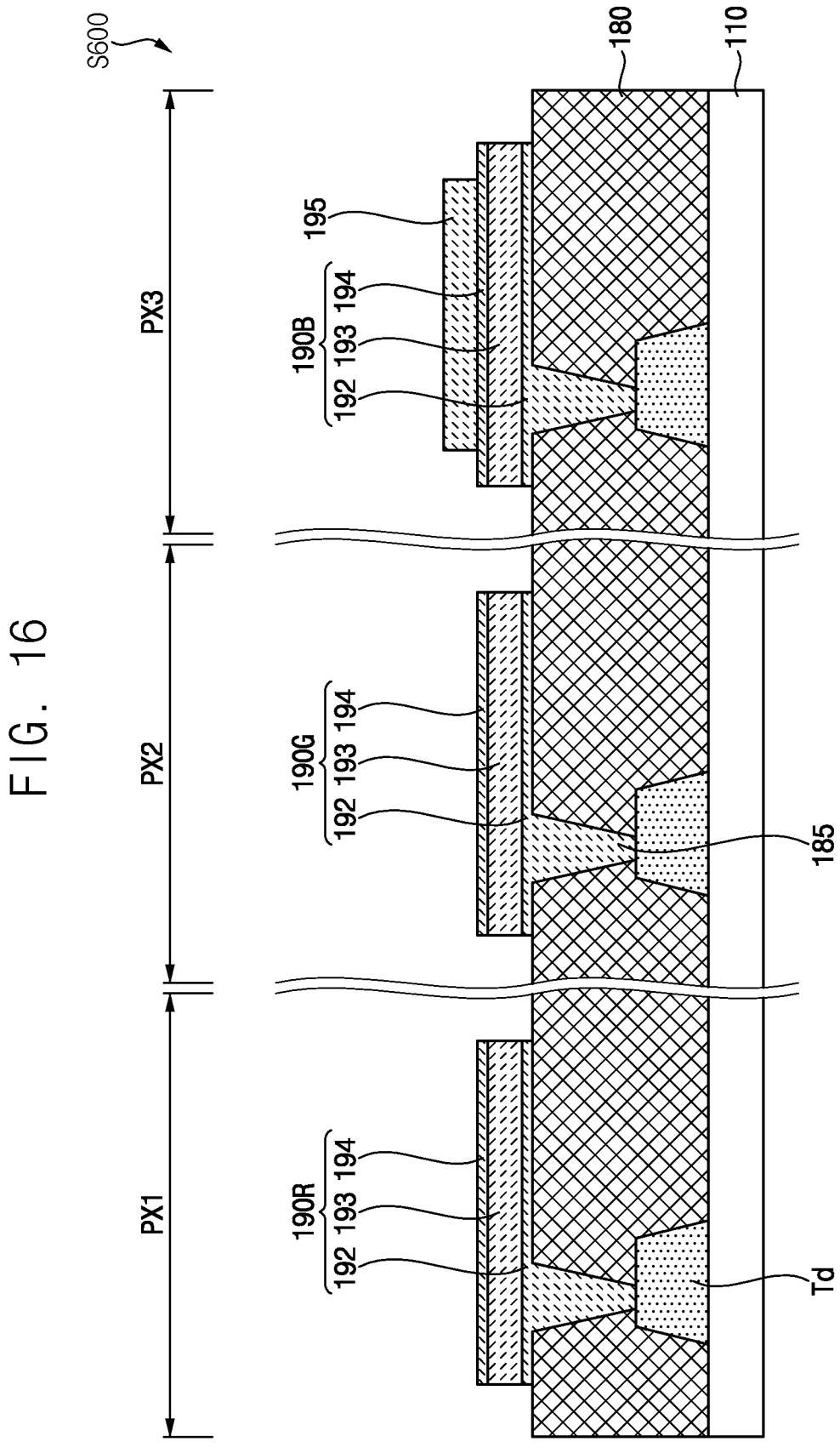

As shown in FIGS. 15 and 16, the remaining photoresist film PRP overlapping the third pixel area PX3 may be removed (S600).

In an embodiment, the remaining photoresist film PRP may be removed by the ashing process. The photoresist may include a hydrocarbon polymer. Therefore, the photoresist may be changed into carbon monoxide, carbon dioxide, water, or the like by reacting with oxygen. Each of the carbon monoxide, the carbon dioxide, and the water may be removed by volatilized.

In an embodiment, the remaining photoresist film PRP may be removed by a stripping process. The remaining photoresist film PRP may be removed using a sulfuric acid, hydrogen peroxide, or the like within the spirit and the scope of the disclosure.

Accordingly, the first pixel electrode 190R, the second pixel electrode 190G, and the third pixel electrode 190B may be formed on the substrate 110.

The first pixel electrode 190R may overlap the first pixel area PX1. The first pixel electrode 190R may include the first transparent oxide layer 192, the metal layer 193, and the second transparent oxide layer 194.

The second pixel electrode 190G may overlap the second pixel area PX2, and a structure of the second pixel electrode 190G may be the same as a structure of the first pixel electrode 190R.

The third pixel electrode 190B may overlap the third pixel area PX3. The third pixel electrode 190B may include the first transparent oxide layer 192, the metal layer 193, and the second transparent oxide layer 194. The thickness compensation layer 195 may be formed on the second transparent oxide layer 194.

However, the disclosure may not be limited thereto. The thickness compensating layer 195 may be disposed on the first pixel electrode 190R or the second pixel electrode 190G.

Figure 17:
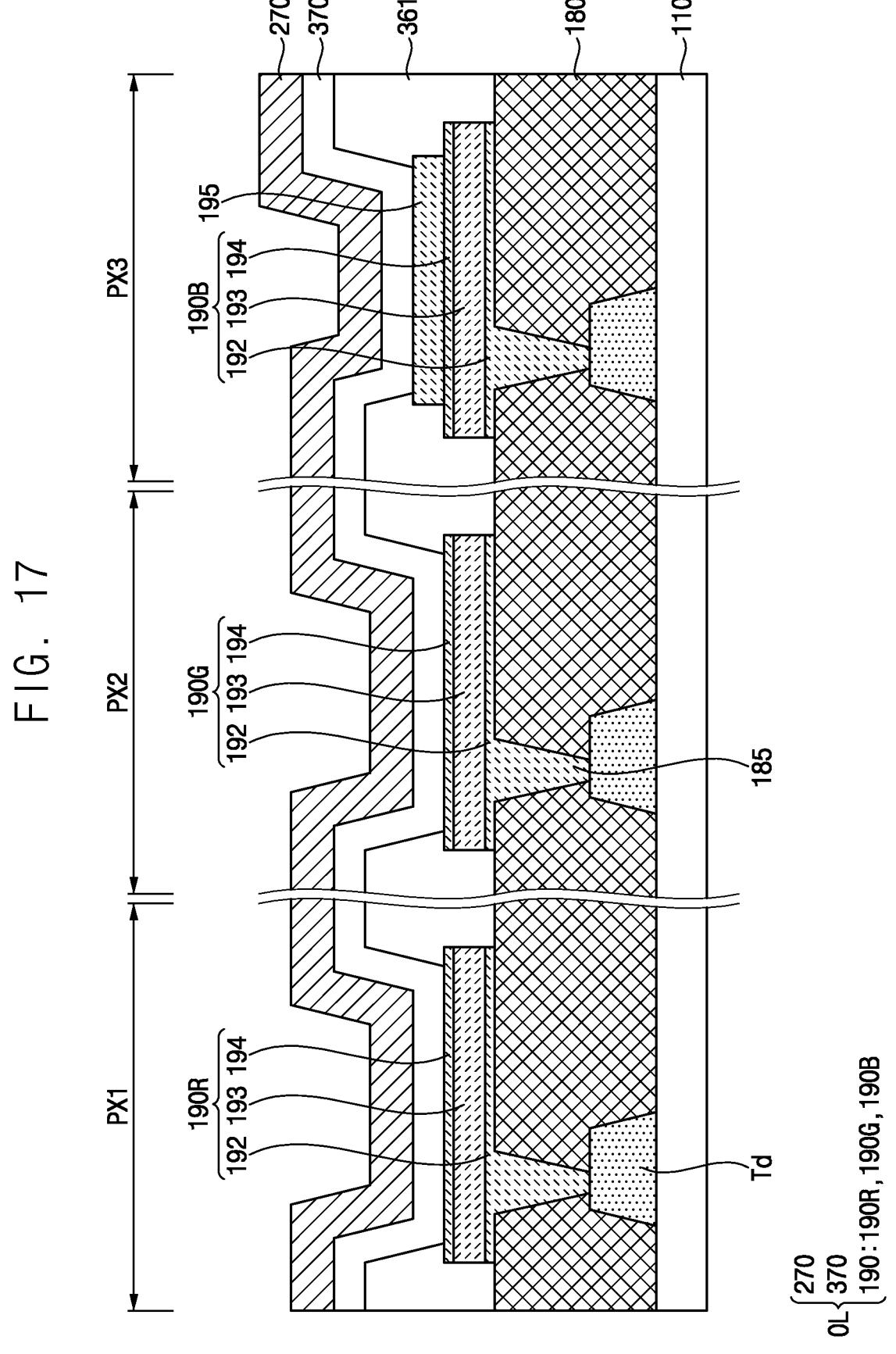

As shown in FIG. 17, a pixel defining layer 361, a light emitting layer 370, and a common electrode 270 may be formed. Accordingly, the organic light emitting display device according to the disclosure may be formed.

The disclosure should not be construed as being limited to the embodiments set forth herein. Rather, these embodiments are provided so that this disclosure will be thorough and complete and will fully convey the concept of the disclosure to those skilled in the art.

While the disclosure has been shown and described with reference to embodiments thereof, it will be understood by those of ordinary skill in the art that various changes in form and details may be made therein without departing from the spirit or scope of the disclosure and as defined by the following claims.

Embodiments may be applied to a display device and an electronic device including the display device such as a computer, a notebook, a smart phone, a smart pad, a PMP, a PDA, an MP3 player, or the like, for example.

What is claimed is:

1. An organic light emitting display device, the organic light emitting display device comprising:
   a first pixel area, a second pixel area, and a third pixel area;
   a first pixel electrode disposed on a substrate in the first pixel area;
   a second pixel electrode disposed on the substrate in the second pixel area;
   a third pixel electrode disposed on the substrate in the third pixel area;
   a pixel defining layer disposed on the substrate, and exposing upper surfaces of the first pixel electrode, the second pixel electrode and the third pixel electrode;
   a first light emitting layer emitting a first color light, and disposed on the first pixel electrode;
   a second light emitting layer emitting a second color light different from the first color light, and disposed on the first pixel electrode, the second pixel electrode and the third pixel electrode;
   a third light emitting layer emitting a third color light different from the first color light and the second color light, and disposed on the third pixel electrode;
   a thickness compensation layer disposed on the third pixel electrode, overlapping the third light emitting layer, and including Z-ITO having $ZnO_x$ content of about 50 wt % or more, and about 90 wt % or less; and
   a common electrode disposed on the first light emitting layer, the second light emitting layer and the third light emitting layer.

2. The organic light emitting display device of claim 1, wherein each of the first pixel electrode, the second pixel electrode and the third pixel electrode includes:
   a first transparent oxide layer disposed on the substrate;
   a metal layer disposed on the first transparent oxide layer; and
   a second transparent oxide layer disposed on the metal layer.

3. The organic light emitting display device of claim 2, wherein,
   the first transparent oxide layer includes ITO,
   the metal layer includes Ag, and
   the second transparent oxide layer includes ITO.

4. The organic light emitting display device of claim 2, wherein an etch selectivity of the thickness compensation layer and an etch selectivity of the second transparent oxide layer are different from each other.

5. The organic light emitting display device of claim 4, wherein the etch selectivity of the thickness compensation layer is greater than the etch selectivity of the second transparent oxide layer.

6. The organic light emitting display device of claim 1, wherein each of the first pixel electrode, the second pixel electrode and the third pixel electrode is an anode, and the common electrode is a cathode.

7. The organic light emitting display device of claim 6, wherein each of the first color light, the second color light and the third color light is resonated between the anode and the cathode.

8. The organic light emitting display device of claim 1, wherein a width of the third pixel electrode and a width of the thickness compensation layer are different from each other in a cross-sectional view.

9. The organic light emitting display device of claim 8, wherein the width of the third pixel electrode is greater than the width of the thickness compensation layer.

\* \* \* \* \*